(12) United States Patent  (10) Patent No.: US 8,208,052 B2
Hiramoto et al.  (45) Date of Patent: Jun. 26, 2012

(54) IMAGE CAPTURE DEVICE

(75) Inventors: Masao Hiramoto, Osaka (JP); Kazuya Yonemoto, Osaka (JP); Yoshiaki Sugitani, Nara (JP)

(73) Assignee: Panasonic Corporation, Osaka (JP)

( * ) Notice: Subject to any disclaimer, the term of this patent is extended or adjusted under 35 U.S.C. 154(b) by 186 days.

(21) Appl. No.: 12/865,161

(22) PCT Filed: Dec. 14, 2009

(86) PCT No.: PCT/JP2009/006853
§ 371 (c)(1),
(2), (4) Date: Jul. 29, 2010

(87) PCT Pub. No.: WO2010/070869
PCT Pub. Date: Jun. 24, 2010

(65) Prior Publication Data
US 2011/0037869 A1  Feb. 17, 2011

(30) Foreign Application Priority Data
Dec. 19, 2008 (JP) .................................. 2008-323679

(51) Int. Cl.
*H04N 5/335* (2011.01)
*H04N 9/07* (2006.01)
*H04N 5/225* (2006.01)
*G02B 27/42* (2006.01)
*H01L 27/00* (2006.01)
*H01L 31/062* (2012.01)

(52) U.S. Cl. ........ 348/294; 348/336; 348/340; 359/558; 250/208.1; 257/291

(58) Field of Classification Search .................. 348/336, 348/340, 294; 359/558; 250/208.1; 257/291–292
See application file for complete search history.

(56) References Cited

U.S. PATENT DOCUMENTS

| | | | |
|---|---|---|---|
| 4,277,138 A * | 7/1981 | Dammann | 359/569 |
| 5,210,400 A | 5/1993 | Usami | |
| 6,882,364 B1 | 4/2005 | Inuiya et al. | |
| 7,110,034 B2 * | 9/2006 | Suda | 348/340 |
| 2002/0003201 A1 | 1/2002 | Yu | |
| 2003/0063204 A1 | 4/2003 | Suda | |
| 2003/0063205 A1 * | 4/2003 | Radl | 348/273 |

(Continued)

FOREIGN PATENT DOCUMENTS

| | | |
|---|---|---|
| JP | 59-090467 | 8/1984 |
| JP | 60-187187 | 9/1985 |

(Continued)

OTHER PUBLICATIONS

International Search Report for corresponding International Application No. PCT/JP2009/006853 mailed Jan. 19, 2010.

*Primary Examiner* — Lin Ye
*Assistant Examiner* — Mekonnen Dagnew
(74) *Attorney, Agent, or Firm* — Renner, Otto, Boisselle & Sklar, LLP

(57) ABSTRACT

A color representation technique to be effectively applicable to a pixel shifted arrangement to realize high sensitivity and high resolution is provided by using a dipersive prism or diffraction.

A dispersive element is provided for an image sensor in which photosensitive cells are arranged to be shifted from each other by a half pitch both horizontally and vertically. The dispersive element makes at least G rays fall straight down to a pixel right under itself and also makes either R rays or B rays incident on an adjacent pixel. Meanwhile, a photosensitive cell, for which no dispersive element is provided, receives directly incident light, too. Color information can be obtained by making computations on photoelectrically converted signals provided by these pixels.

12 Claims, 9 Drawing Sheets

U.S. PATENT DOCUMENTS

| | | |
|---|---|---|
| 2004/0100570 A1 | 5/2004 | Shizukuishi |
| 2009/0115011 A1 | 5/2009 | Ushiro et al. |
| 2011/0164156 A1* | 7/2011 | Hiramoto et al. ............. 348/272 |

FOREIGN PATENT DOCUMENTS

| | | |
|---|---|---|
| JP | 04-074469 | 3/1992 |
| JP | 11-313334 | 11/1999 |
| JP | 2000-151933 | 5/2000 |
| JP | 2002-502120 | 1/2002 |
| JP | 2003-078917 | 3/2003 |
| JP | 2005-167356 | 6/2005 |
| JP | 2007-109801 | 4/2007 |

* cited by examiner (a)

(b)

(c)

(a)

(b)

(c)

IMAGE CAPTURE DEVICE

TECHNICAL FIELD

The present invention relates to a solid-state imaging device structure for use in an image capture device.

BACKGROUND ART

Recently, the performance and functionality of digital cameras and digital movie cameras that use some solid-state imaging device such as a CCD and a CMOS (which will be sometimes referred to herein as an "image sensor") have been enhanced to an astonishing degree. In particular, the size of a pixel structure for use in a solid-state imaging device has been further reduced these days thanks to development of semiconductor device processing technologies, thus getting an even greater number of pixels and drivers integrated together in a solid-state imaging device. As a result, the resolution of an image sensor has lately increased significantly from one million pixels to ten million pixels in a matter of few years. Meanwhile, the greater the number of pixels in an image sensor, the lower the intensity of the light falling on a single pixel (which will be referred to herein as a "light intensity") and the lower the sensitivity of the image capture device tends to be.

On top of that, in a normal color camera, a subtractive organic dye filter (color filter) that uses an organic pigment as a dye is arranged over each photosensing section of an image sensor, and therefore, the optical efficiency achieved is rather low. In a Bayer color filter, which uses a combination of one red (R) pixel, two green (G) pixels and one blue (B) pixel as a fundamental unit, the R filter transmits an R ray but absorbs G and B rays, the G filter transmits a G ray but absorbs R and B rays, and the B filter transmits a B ray but absorbs R and G rays. That is to say, each color filter transmits only one of the three colors of R, G and B and absorbs the other two colors. Consequently, the light ray used by each color filter is only approximately one third of the visible radiation falling on that color filter.

To overcome such a problem of decreased sensitivity, Patent Document No. 1 discloses a technique for increasing the intensity of the light received by attaching an array of micro lenses to a photodetector section of an image sensor. According to this technique, the incoming light is condensed with those micro lenses, thereby substantially increasing the aperture ratio. And this technique is now used in almost all solid-state imaging devices. It is true that the aperture ratio can be increased substantially by this technique but the decrease in optical efficiency by color filters still persists.

Thus, to avoid the decrease in optical efficiency and the decrease in sensitivity at the same time, Patent Document No. 2 discloses a solid-state imaging device that has a structure for taking in as much incoming light as possible by using dichroic mirrors and micro lenses in combination. Such a device uses a combination of dichroic mirrors, each of which does not absorb light but selectively transmits only a component of light falling within a particular wavelength range and reflects the rest of the light falling within the other wavelength ranges. Each dichroic mirror selects only a required component of the light, directs it toward its associated photosensing section and transmits the rest of the light. FIG. 9 is a cross-sectional view of such an image sensor as the one disclosed in Patent Document No. 2.

In the image sensor shown in FIG. 9, the light that has reached a condensing micro lens 11 has its luminous flux adjusted by an inner lens 12, and then impinges on a first dichroic mirror 13, which transmits a red (R) ray but reflects rays of the other colors. The light ray that has been transmitted through the first dichroic mirror 13 is then incident on a photosensitive cell 23 that is located right under the first dichroic mirror 13. On the other hand, the light ray that has been reflected from the first dichroic mirror 13 impinges on a second dichroic mirror 14 adjacent to the first dichroic mirror 13. The second dichroic mirror 14 reflects a green (G) ray and transmits a blue (B) ray. The green ray that has been reflected from the second dichroic mirror 14 is incident on a photosensitive cell 24 that is located right under the second dichroic mirror 14. On the other hand, the blue ray that has been transmitted through the second dichroic mirror 14 is reflected from a third dichroic mirror 15 and then incident on a photosensitive cell 25 that is located right under the dichroic mirror 15. In this manner, in the image sensor shown in FIG. 9, the visible radiation that has reached the condensing micro lens 11 is not lost but their RGB components can be detected by the three photosensitive cells non-wastefully.

Meanwhile, Patent Document No. 3 discloses a technique that uses a micro prism. According to that technique, the incoming light is split by the micro prism 16 into red (R), green (G) and blue (B) rays, which are received by their associated photosensing sections as shown in FIG. 10. Even with such a technique, the R, G and B components can also be detected with no optical loss caused.

According to the techniques disclosed in Patent Documents Nos. 2 and 3, however, the number of photosensing sections to provide needs to be as many as that of the color components to separate. That is why to receive red, green and blue rays that have been split, for example, the number of photosensing sections provided should be tripled compared to a situation where conventional color filters are used.

Thus, to overcome such problems with the prior art, Patent Document No. 5 discloses a technique for increasing the optical efficiency by using dichroic mirrors and reflected light, although some loss of the incoming light is involved. FIG. 11 is a partial cross-sectional view of an image sensor that adopts such a technique. As shown in FIG. 11, dichroic mirrors 32 and 33 are embedded in a light-transmitting resin 31. Specifically, the dichroic mirror 32 transmits a G ray and reflects R and B rays, while the dichroic mirror 33 transmits an R ray and reflects G and B rays.

Such a structure cannot receive a B ray at its photosensing section but can sense R and G rays with no loss under the following principle. First, if an R ray impinges on the dichroic mirrors 32 and 33, the R ray is reflected from the dichroic mirror 32, is totally reflected from the interface between the light-transmitting resin 31 and the air, and then impinges on the dichroic mirror 33. Then, almost all of the R ray that has impinged on the dichroic mirror 33 is transmitted through the organic dye filter 35 and the micro lens 36 that transmit the R ray and then incident on the photosensing section, even though only a part of the R ray is reflected from the metal layer 37. On the other hand, if a G ray impinges on the dichroic mirrors 32 and 33, the G ray is reflected from the dichroic mirror 33, is totally reflected from the interface between the light-transmitting resin 31 and the air, and then impinges on the dichroic mirror 32. Then, almost all of the G ray that has impinged on the dichroic mirror 32 is transmitted through the organic dye filter 34 and the micro lens 36 that transmit the G ray and eventually incident on the photosensing section with virtually no loss.

According to the technique disclosed in Patent Document No. 5, only one of the three color components of RGB is lost but light rays of the other two colors can be received with almost no loss based on the principle described above. That is why there is no need to provide photosensing sections for all of the three colors of RGB. In this case, comparing such an image sensor to an image sensor that uses only organic dye filters, it can be seen that the optical efficiency can be doubled by this technique. Still, even if such a technique is adopted, the optical efficiency cannot be 100%, as one out of the three colors should be sacrificed.

Meanwhile, to increase the horizontal and vertical resolutions of an image capture device, a so-called "pixel shifted" arrangement, in which the pixels are shifted by a half pitch between two adjacent rows and between two adjacent columns, is sometimes adopted instead of the conventional square arrangement. An image sensor in which pixels are shifted both horizontally and vertically is disclosed in Patent Document No. 5, for example. In such an image sensor, a photosensing section is arranged in a diamond shape so that signals supplied from respective pixels are read out from CCDs that are arranged in a zigzag pattern. By shifting the pixels by a half pitch both horizontally and vertically, the horizontal and vertical resolution can be both increased.

Citation List

Patent Literature

Patent Document No. 1: Japanese Patent Application Laid-Open Publication No. 59-90467

Patent Document No. 2: Japanese Patent Application Laid-Open Publication No. 2000-151933

Patent Document No. 3: PCT International Application Japanese National Phase Publication No. 2002-502120

Patent Document No. 4: Japanese Patent Application Laid-Open Publication No. 2003-78917

Patent Document No. 5: Japanese Patent Application Laid-Open Publication No. 60-187187

SUMMARY OF INVENTION

Technical Problem

According to some conventional techniques, the three color components of R, G and B can be obtained by using color filters that absorb incoming light or dichroic mirrors that split the incoming light according to the wavelength range. However, those techniques will either result in low optical efficiency or require a lot of photosensing sections, which is a problem either way. That is to say, nobody has ever proposed a color representation technique that will achieve higher sensitivity than any of those conventional techniques, will not require so many photosensing sections, and can be used effectively to realize a pixel shifted arrangement that contributes to achieving high resolution.

It is therefore an object of the present invention to provide an image capture device that can use such a pixel shifted arrangement effectively along with dispersive optical elements to realize high sensitivity and high resolution. Another object of the present invention is to provide a solid-state image sensor for use in such an image capture device.

Solution to Problem

An image capture device according to the present invention includes: a solid-state image sensor; an optical system for producing an image on an imaging area of the solid-state image sensor; and a signal processing section for processing an electrical signal supplied from the solid-state image sensor. The solid-state image sensor includes a photosensitive cell array, in which a number of photosensitive cells are arranged two-dimensionally on the imaging area, and a dispersive element array, in which a number of dispersive elements are arranged for some of the photosensitive cells that form the photosensitive cell array. The photosensitive cell array and the dispersive element array are formed of a number of units. Each of those units includes first, second and third photosensitive cells, and at least one dispersive element, which is arranged so as to face at least one of the first and second photosensitive cells. In each unit, each dispersive element makes a part of its received light, which falls within a first wavelength range including at least a green wavelength range, incident on the photosensitive cell that faces the dispersive element, and also makes another part of its received light, which falls within a non-first wavelength range, incident on at least one photosensitive cell other than the photosensitive cell that faces the dispersive element. The first, second and third photosensitive cells respectively output first, second and third photoelectrically converted signals representing the intensities of the light received by them. The signal processing section outputs color information by making computations on the first, second and third photoelectrically converted signals.

In one preferred embodiment, in each unit, the second photosensitive cell is arranged adjacent to the first photosensitive cell, and the third photosensitive cell is arranged adjacent to the second photosensitive cell. Supposing a line that connects together respective centers of the first and second photosensitive cells is called a first line and a line that connects together the respective centers of the second and third photosensitive cells is called a second line, the first and second lines cross each other.

In this particular preferred embodiment, the angle defined by the first line with respect to the vertical side of the imaging area is equal to the angle defined by the second line with respect to the vertical side of the imaging area.

In another preferred embodiment, in each unit, each dispersive element makes a part of its received light, which falls within a red or blue wavelength range, incident on at least one photosensitive cell other than the first photosensitive cell that faces the dispersive element.

In this particular preferred embodiment, each unit includes: a first dispersive element, which is arranged to face the first photosensitive cell, and a second dispersive element, which is arranged to face the second photosensitive cell.

In a specific preferred embodiment, if one of the red and blue wavelength ranges is called a second wavelength range and the other is called a third wavelength range, the first dispersive element makes a part of its received light, which falls within the second wavelength range, incident on the second photosensitive cell and also makes the rest of its received light incident on the first photosensitive cell. The second dispersive element makes a part of its received light, which falls within the third wavelength range, incident on the third photosensitive cell and also makes the rest of its received light incident on the second photosensitive cell. The first photosensitive cell receives the light that has impinged on the first dispersive element other than the light falling within the second wavelength range. The second photosensitive cell receives not only the light that has impinged on the second dispersive element other than the light falling within the third wavelength range but also the light that falls within the second wavelength range and that has come from the first dispersive element. And the third photosensitive cell receives not only the incident light that has come directly without passing through any dispersive element but also the light that falls within the third wavelength range and that has come from the second dispersive element.

In an alternative preferred embodiment, if one of the red and blue wavelength ranges is called a second wavelength range and the other is called a third wavelength range, then in each unit, the first dispersive element makes a part of its received light, which falls within the second wavelength range and which has a first quantity corresponding to a half of the light that falls within the second wavelength range, incident on the second photosensitive cell, makes the other half incident on a photosensitive cell included in a first adjacent unit, and also makes the rest of its received light that falls within the first and third wavelength ranges incident on the first photosensitive cell. The second dispersive element makes a part of its received light, which falls within the third wavelength range and which has a second quantity corresponding to a half of the light that falls within the third wavelength range, incident on the third photosensitive cell, makes the other half incident on a photosensitive cell included in a second adjacent unit, and also makes the light that falls within the first wavelength range and the light that falls within the second wavelength range incident on the second photosensitive cell. The first photosensitive cell receives not only the light that has impinged on the first dispersive element other than the light falling within the second wavelength range but also light having the second quantity, falling within the third wavelength range, and having come from a dispersive element included in a third adjacent unit. The second photosensitive cell receives not only the light that has impinged on the second dispersive element other than the light falling within the third wavelength range but also the light having the first quantity, falling within the second wavelength range, and having come from the first dispersive element. The third photosensitive cell receives the incident light that has come directly without passing through any dispersive element, the light having the second quantity, falling within the third wavelength range and having come from the second dispersive element, and the light having the first quantity, falling within the second wavelength range, and having come from a dispersive element included in a fourth adjacent unit.

In still another preferred embodiment, if one of the red and blue wavelength ranges is called a second wavelength range and the other is called a third wavelength range, then in each unit, the first dispersive element makes a part of its received light, which has a first quantity and which falls within the second wavelength range, incident on the second photosensitive cell, makes another part of its received light, which has a second quantity and which falls within the third wavelength range, incident on a photosensitive cell included in a first adjacent unit, and also makes still another part of its received light, which falls within the first wavelength range, incident on the first photosensitive cell. The second dispersive element makes a part of its received light, which has the first quantity and which falls within the second wavelength range, incident on the third photosensitive cell, makes another part of its received light, which has the second quantity and which falls within the third wavelength range, incident on a photosensitive cell included in a second adjacent unit, and also makes still another part of its received light, which falls within the first wavelength range, incident on the second photosensitive cell. The first photosensitive cell receives not only the light that has impinged on the first dispersive element other than the light having the first quantity and falling within the second wavelength range and the light having the second quantity and falling within the third wavelength range but also light having a third quantity, falling within the third wavelength range and having come from a dispersive element included in a third adjacent unit. The second photosensitive cell receives not only the light that has impinged on the second dispersive element other than the light having the first quantity and falling within the second wavelength range and the light having the second quantity and falling within the third wavelength range but also light having a fourth quantity, falling within the second wavelength range and having come from the first dispersive element. The third photosensitive cell receives the incident light that has come directly without passing through any dispersive element, light having a fifth quantity, falling within the second wavelength range and having come from the second dispersive element, and light having a sixth quantity, falling within the third wavelength range and having come from a dispersive element included in a fourth adjacent unit.

In yet another preferred embodiment, if one of the red and blue wavelength ranges is called a second wavelength range and the other is called a third wavelength range, then in each unit, the first dispersive element makes a part of its received light, which has a first quantity and which falls within the second wavelength range, incident on the second photosensitive cell, makes another part of its received light, which has a second quantity and which falls within the third wavelength range, incident on a photosensitive cell included in a first adjacent unit, and also makes still another part of its received light, which falls within the first wavelength range, incident on the first photosensitive cell. The second dispersive element makes a part of its received light, which has the first quantity and which falls within the second wavelength range, incident on a photosensitive cell included in a second adjacent unit, makes another part of its received light, which has the second quantity and which falls within the third wavelength range, incident on the third photosensitive cell, and also makes still another part of its received light, which falls within the first wavelength range, incident on the second photosensitive cell. The first photosensitive cell receives not only the light that has impinged on the first dispersive element other than the light having the first quantity and falling within the second wavelength range and the light having the second quantity and falling within the third wavelength range but also light having a third quantity, falling within the second wavelength range and having come from a dispersive element included in a third adjacent unit. The second photosensitive cell receives not only the light that has impinged on the second dispersive element other than the light having the first quantity and falling within the second wavelength range and the light having the second quantity and falling within the third wavelength range but also light having a fourth quantity, falling within the second wavelength range and having come from the first dispersive element. The third photosensitive cell receives the incident light that has come directly without passing through any dispersive element, light having a fifth quantity, falling within the third wavelength range and having come from a dispersive element included in a fourth adjacent unit, and light having a sixth quantity, falling within the third wavelength range and having come from the second dispersive element.

In a specific preferred embodiment, the fourth and fifth quantities are equal to the first quantity and the third and sixth quantities are equal to the second quantity.

In yet another preferred embodiment, in each unit, the dispersive element is arranged so as to face the first photosensitive cell. If one of the red and blue wavelength ranges is called a second wavelength range and the other is called a third wavelength range, then the dispersive element makes a part of its received light, which has a first quantity and which falls within the second wavelength range, incident on the second photosensitive cell, makes another part of its received light, which has a second quantity and which falls within the third wavelength range, incident on a photosensitive cell included in a first adjacent unit, and also makes still another part of its received light, which falls within the first wavelength range, incident on the first photosensitive cell. The first photosensitive cell receives the light that has impinged on the dispersive element other than the light falling within the second wavelength range and the light falling within the third wavelength range. The second photosensitive cell receives not only the incident light that has come directly without passing through any dispersive element but also light having a first quantity, falling within the second wavelength range and having come from the dispersive element. And the third photosensitive cell receives not only the incident light that has come directly without passing through any dispersive element but also light having a second quantity, falling within the third wavelength range and having come from a dispersive element included in a second adjacent unit.

A solid-state image sensor according to the present invention includes a photosensitive cell array, in which a number of photosensitive cells are arranged two-dimensionally on an imaging area, and a dispersive element array, in which a number of dispersive elements are arranged for some of the photosensitive cells that form the photosensitive cell array. The photosensitive cell array and the dispersive element array are formed of a number of units. Each of those units includes first, second and third photosensitive cells, and at least one dispersive element, which is arranged so as to face at least one of the first and second photosensitive cells. In each unit, each dispersive element makes a part of its received light, which falls within a first wavelength range including at least a green wavelength range, incident on the photosensitive cell that faces the dispersive element, and also makes another part of its received light, which falls within a non-first wavelength range, incident on at least one photosensitive cell other than the first photosensitive cell. And the first, second and third photosensitive cells respectively output first, second and third photoelectrically converted signals representing the intensities of the light received by them.

Advantageous Effects of Invention

Since the image capture device of the present invention uses a dispersive element, first of all, high sensitivity is achieved without causing any optical loss. In addition, since a light ray with green (G) component, which will achieve high luminous efficacy, is incident on a photosensitive cell that faces the dispersive element, the resolution can be increased. On top of that, three color signals can be obtained by making computations on the photoelectrically converted signals generated by three photosensitive cells. As a result, a color image can be captured with a minimum number of pixels used effectively to form a pixel shifted arrangement.

DESCRIPTION OF EMBODIMENTS

Figure 1:
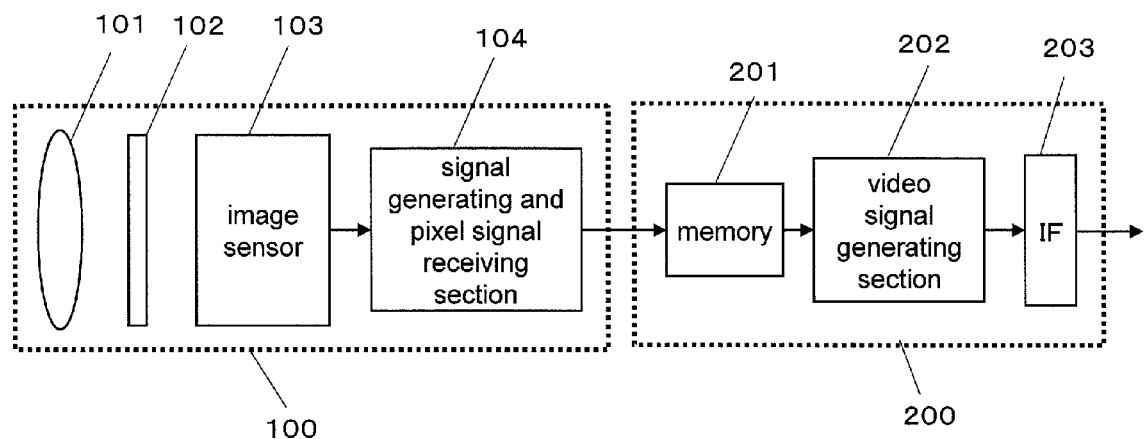
FIG. 1 is a block diagram illustrating an exemplary configuration for an image capture device as a preferred embodiment of the present invention.

Hereinafter, preferred embodiments of the present invention will be described with reference to the accompanying drawings, in which any pair of components shown in multiple sheets and having substantially the same function will be identified by the same reference numeral.

Embodiment 1

FIG. 1 is a block diagram illustrating an overall configuration for an image capture device as a first specific preferred embodiment of the present invention. The image capture device shown in FIG. 1 includes an image capturing section 100 and a signal processing section 200 that receives a signal from the image capturing section 100 and generates a video signal. The configuration and operation of the image capturing section 100 and the signal processing section 200 will be described.

The image capturing section 100 includes a lens 101 for imaging a given subject, an optical plate 102, an image sensor 103 for converting optical information, which has been collected by imaging the subject through the lens 101 and the optical plate 102, into an electrical signal by photoelectric conversion, and a signal generating and pixel signal receiving section 104. In this case, the optical plate 102 is a combination of a quartz crystal low-pass filter for reducing a moiré pattern to be caused by a pixel arrangement with an infrared cut filter for filtering out infrared rays. The signal generating and pixel signal receiving section 104 generates a fundamental signal to drive the image sensor 103 and receives a signal from the image sensor 103 and passes it to the signal processing section 200.

The signal processing section 200 includes an image memory 201 to store the signal supplied from the signal generating and image signal receiving section 104, a video signal generating section 202 for generating a video signal (high definition signal) based on the data that has been read out from the image memory 201, and an interface (IF) section 203 that outputs the video signal to an external device.

It should be noted that this configuration is only an example and that according to the present invention, all components but the image sensor 103 can be an appropriate combination of known elements. Hereinafter, an image sensor 103 according to this preferred embodiment will be described. In the following description, the colors red, green and blue will be identified herein by R, G and B, respectively.

Figure 2:
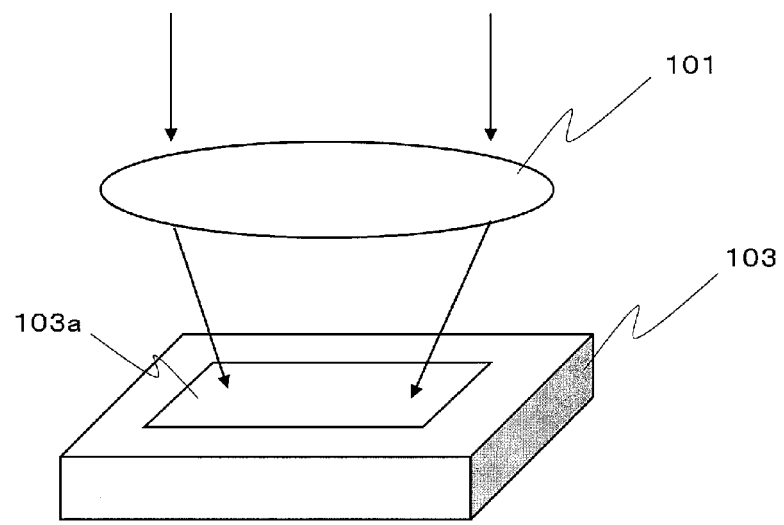
FIG. 2 is perspective view illustrating how a lens and an image sensor are arranged in preferred embodiments of the present invention.

FIG. 2 schematically illustrates how the light that has been transmitted through the lens 101 is incident on the image sensor 103. On the imaging area 103a of the image sensor 103, arranged two-dimensionally are a lot of photosensitive cells. Since the light is imaged by the lens 101 and processed by the low-pass filter, light (visible radiation) is incident on the imaging area 103a. The intensity of the light falling on the imaging area 103a (which will be referred to herein as an "incident light intensity") and the distribution of the light intensity according to the wavelength range vary with the point of incidence. Those photosensitive cells are typically photodiodes, each of which outputs an electrical signal representing the incident light intensity by photoelectric conversion (such a signal will be referred to herein as a "photoelectrically converted signal").

The image sensor 103 is typically implemented as a CCD or a CMOS sensor and is fabricated by known semiconductor device processing. In the image sensor 103 of this preferred embodiment, an array of dispersive elements (light-splitting elements) is arranged so as to face that side with the array of photosensitive cells.

An image capture device according to this preferred embodiment can generate a color image signal by getting the incoming light split by an array of dispersive elements. In this device, the output signal of a single photosensitive cell includes a superposition of signal components representing light rays falling within multiple different wavelength ranges. By making a computation on the output signal of one photosensitive cell and that of another photosensitive cell, color signals representing the three colors of R, G and B can be extracted.

Figure 8:
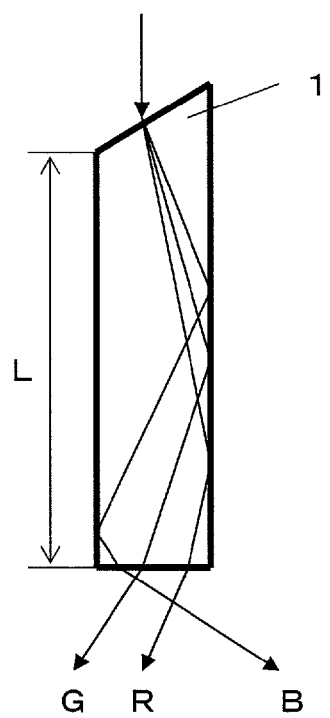
FIG. 8 illustrates the appearance of a micro prism for use in various preferred embodiments of the present invention.
Figure 9:
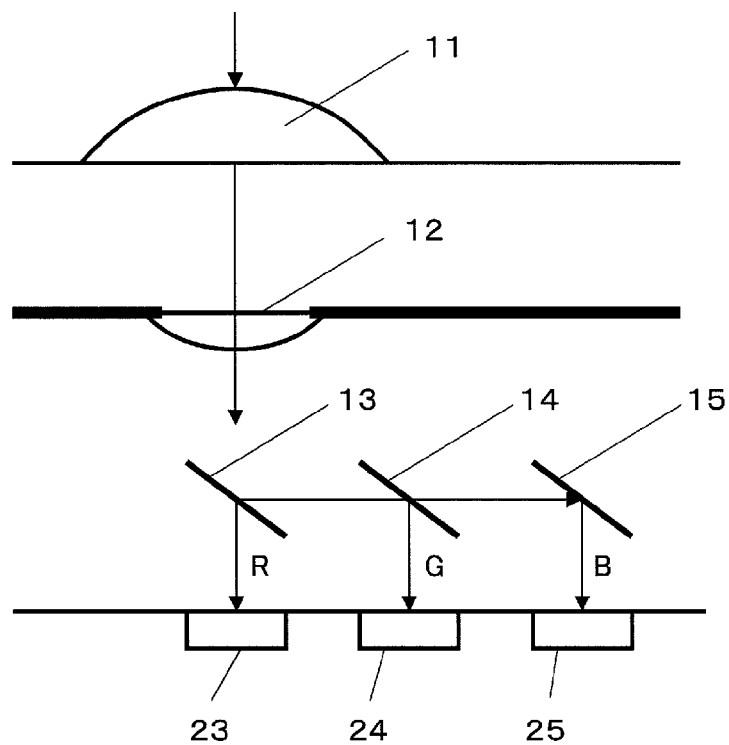
FIG. 9 is a cross-sectional view illustrating a conventional solid-state image sensor that uses a micro lens and dichroic mirrors in combination.
Figure 10:
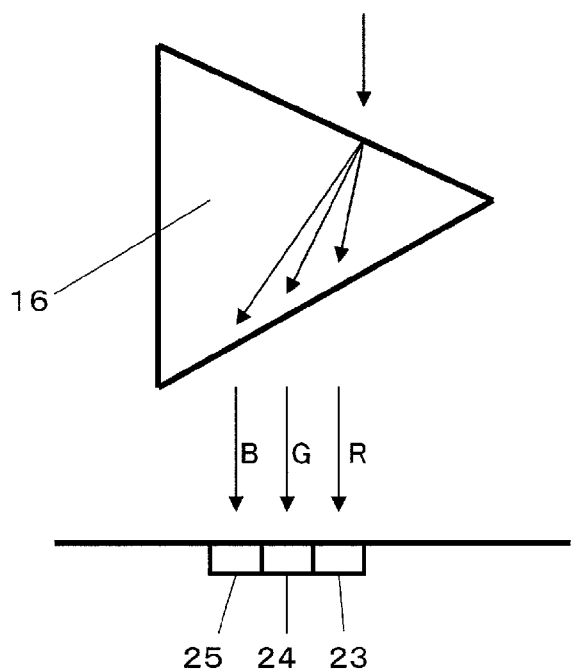
FIG. 10 illustrates how incoming light is split by a micro prism and then received according to a conventional technique.
Figure 11:
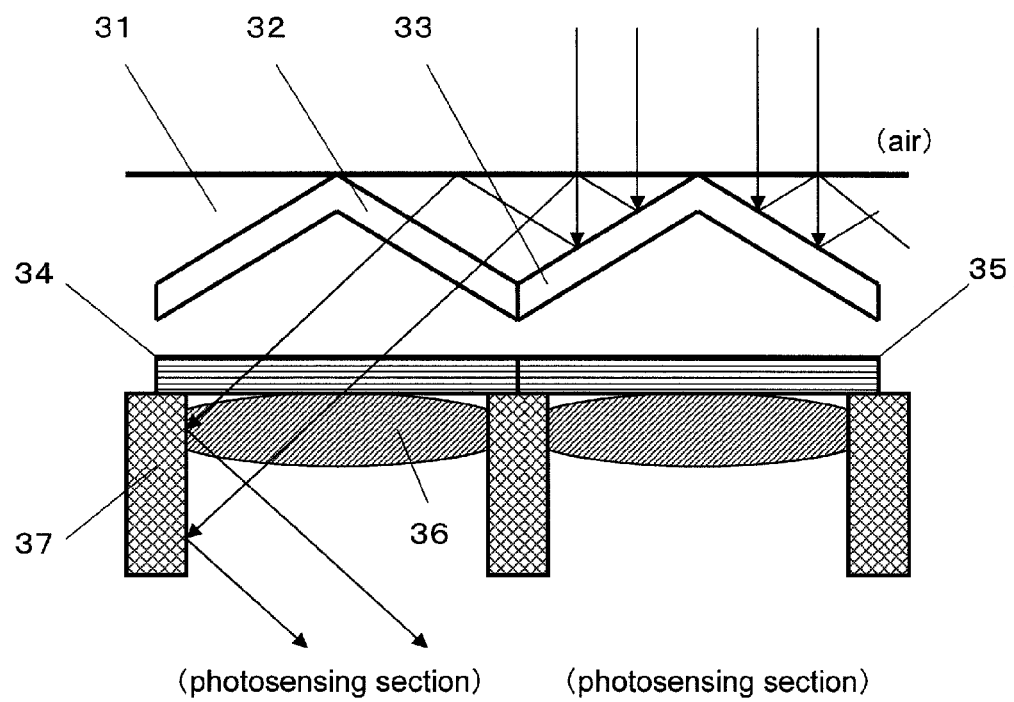
FIG. 11 is a cross-sectional view of an image sensor that achieves increased optical efficiency by using reflection by dichroic mirrors.

The dispersive element of this preferred embodiment may be a micro prism in a quadrangular prism shape as shown in FIG. 8. If light is incident on such a micro prism, the angle of refraction varies according to its wavelength, so does its path. That is why by adjusting the length L of such a micro prism, the point of incidence of each color ray on the photosensitive plane of a photosensitive cell can be controlled.

FIG. 8 illustrates a situation where the blue (B) ray is directed toward a cell that is located diagonally below the micro prism, and its complementary color ray (yellow=red (R)+green (G)) is directed toward a cell located right under the micro prism. By adjusting the length L of the micro prism and its three-dimensional position with respect to its associated photosensitive cell, the colors of rays to be incident on a photosensitive cell right under the micro prism can be changed. To spatially split incoming light into multiple components of light falling within mutually different wavelength ranges will be referred to herein as "splitting of light".

Thus, the prism type dispersive element shown in FIG. 8 can transmit a light ray falling within a first wavelength range toward a direction that defines a first angle with respect to the incoming light and can also transmit a light ray falling within a second wavelength range (and representing the complementary color of that of the light ray falling within the first wavelength range) toward a direction that defines a second angle with respect to the incoming light. Optionally, by adjusting its length L and its relative position with respect to its associated photosensitive cell, light rays falling within respectively different wavelength ranges can also be transmitted in three different directions. Each of those split light rays falling within the respective wavelength ranges is in a plane including the incoming light. That is why if the dispersive element being arranged is turned on the optical axis of the incoming light, then the direction of that plane including the split light ray can be changed.

An array of dispersive elements, including such dispersive elements, may be fabricated by performing thin-film deposition and patterning processes by known semiconductor device processing technologies. Those dispersive elements may be arranged two-dimensionally in any of various patterns. By appropriately determining the arrangement pattern of those dispersive elements, the incoming light can be split into light rays falling within desired wavelength ranges, or some of those split light rays can be combined together if necessary, before those light rays strike on their associated photosensitive cells that form the array of photosensitive cells. As a result, a signal representing a required color component can be derived from a set of photoelectrically converted signals supplied from the photosensitive cells.

Hereinafter, the image sensor 103 of this preferred embodiment will be described in further detail with reference to FIGS. 3(a) to 3(c). In the following description, an area of the imaging area that is provided for one photosensitive cell will sometimes be referred to herein as a "pixel". As used herein, "right under" refers to the direction pointing to the bottom of the paper on which FIGS. 3(b) and 3(c), FIGS. 4(b) and 4(c), FIGS. 6(b) and 6(c) or FIGS. 7(b) and 7(c) are drawn. Likewise, "diagonally", "diagonally below", "diagonally above" or any other direction related term will be construed herein by the drawing being referred to. In a real world image capture device, however, the direction that its imaging area faces is always changing. That is why any of those direction related terms used in this description actually means any of various directions according to which direction the imaging area is now facing.

Figure 3:
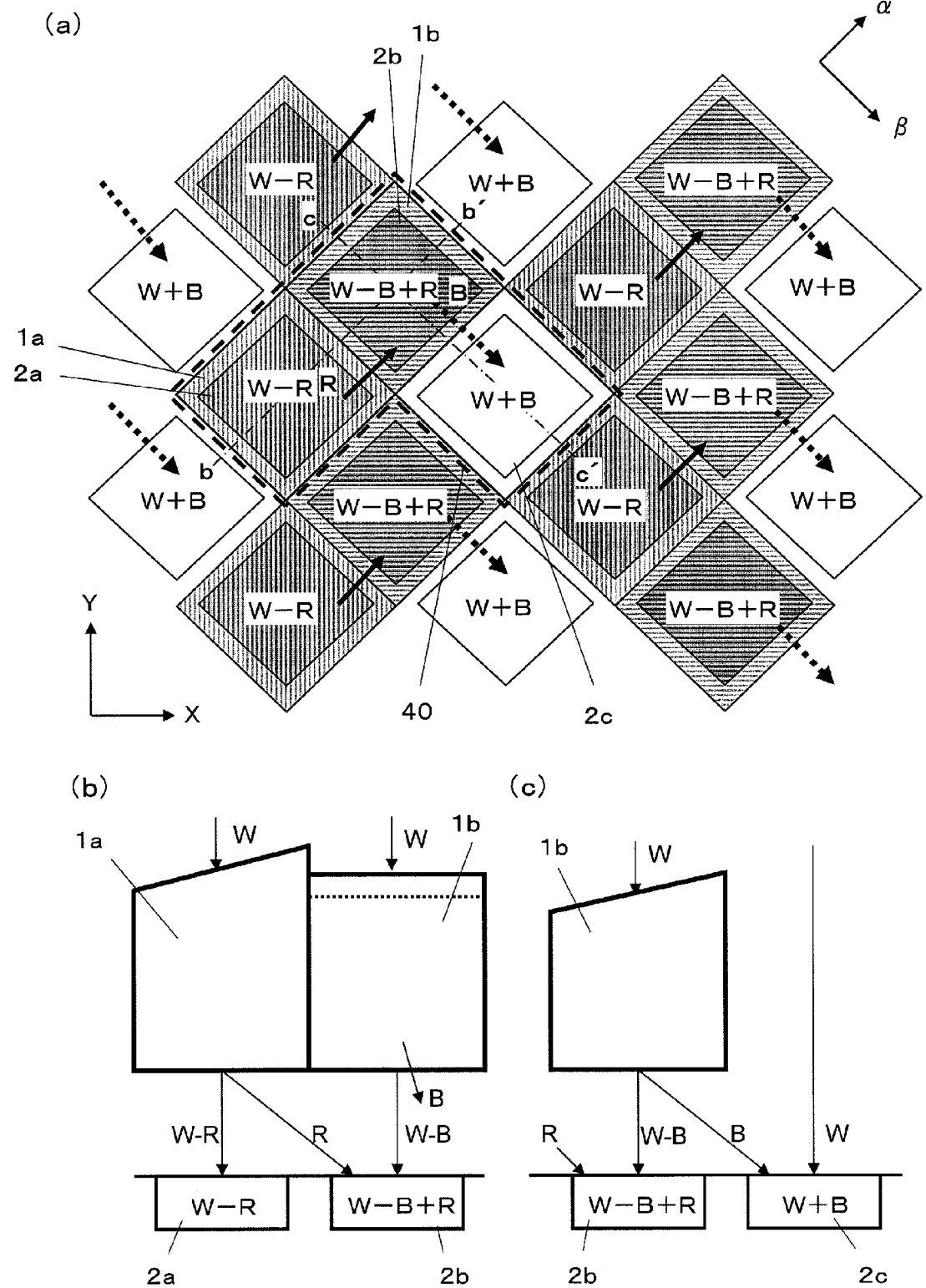
FIG. 3(a) is a pixel plan view according to a first specific preferred embodiment of the present invention and FIGS. 3(b) and 3(c) are cross-sectional views of the pixel plane of the first preferred embodiment as viewed on the plane b-b' and c-c', respectively.

FIG. 3(a) is a pixel plan view illustrating a part of an array of dispersive elements, a part of an array of photosensitive cells and how light is split in a solid-state image sensor according to this preferred embodiment. As shown in FIG. 3(a), three columns, in each of which a number of photosensitive cells 2a, 2b or 2c are arranged vertically (i.e., in the Y direction) on the imaging area, alternate one another horizontally (i.e., in the X direction). Each of those photosensitive cells is shifted from each of its nearest photosensitive cells of adjacent columns by a half pitch both horizontally and vertically (i.e., in the X and Y directions on the imaging area). Also, two different types of micro prisms 1a and 1b are arranged as dispersive elements so as to face the photosensitive cells 2a and 2b, respectively. However, no dispersive elements are provided for the photosensitive cells 2c.

In the image sensor of this preferred embodiment, a number of units 40, each consisting of three photosensitive cells 2a, 2b and 2c and two dispersive elements 1a and 1b, are arranged in columns and rows. All of these units are arranged so as to point to the same direction. Also, in each of these units, the photosensitive cell 2b is arranged adjacent to the other photosensitive cells 2a and 2c. Furthermore, the line b-b' that passes the respective centers of the photosensitive cells 2a and 2b crosses the line c-c' that passes the respective centers of the photosensitive cells 2b and 2c. In the arrangement of photosensitive cells illustrated in FIG. 3(a), the angle defined by the line b-b' with respect to the Y direction of the imaging area is supposed to be equal to the one defined by the line c-c' with respect to that Y direction. However, this is only an example and those angles do not always have to be equal to each other. On the other hand, FIGS. 3(b) and 3(c) are cross-sectional views of these arrays as viewed on the respective planes defined by the lines b-b' and c-c' shown in FIG. 3(a). In FIGS. 3(a) to 3(c), also shown are the color components of the light rays received by the respective photosensitive cells.

As shown in FIGS. 3(a) to 3(c), the micro prism 1a splits the incoming light into an R ray and a cyan (Cy=G+B) ray representing its complementary color, makes the cyan ray incident on the photosensitive cell 2a that is located right under itself, and also makes the R ray (indicated by the solid arrow in FIG. 3(a)) incident on the photosensitive cell 2b that is located diagonally above itself (i.e., in the α direction) in FIG. 3(a). On the other hand, the micro prism 1b splits the incoming light into a B ray and a yellow (Ye=R+G) ray representing its complementary color, makes the yellow ray incident on the photosensitive cell 2b that is located right under itself and also makes the B ray (indicated by the dotted arrow in FIG. 3(a)) incident on the photosensitive cell 2c that is located diagonally below itself (i.e., in the β direction) in FIG. 3(a). Meanwhile, directly incident light strikes the photosensitive cell 2c without passing through any dispersive element. In FIG. 3(b), the B ray indicated by the arrow pointing diagonally downward from the micro prism 1b is the same as the B ray leaving the micro prism 1b shown in FIG. 3(c).

The light (visible radiation) that has been incident on each unit 40 is split into three light rays falling within respective wavelength ranges that represent the colors R, G and B. And the intensity of the light received by each photosensitive cell is the sum of the intensities of the light rays falling within those R, G and B wavelength ranges. Supposing photoelectrically converted signals representing the respective intensities of the light rays falling within the R, G and B wavelength ranges are identified by Rs, Gs and Bs, respectively, a signal Ws representing the intensity of the incoming light yet to be split in the area where each photosensitive cell is located is given by Ws=Rs+Gs+Bs. After the incoming light is split by the micro prisms 1a and 1b, the photosensitive cells 2a, 2b and 2c will output photoelectrically converted signals S2a, S2b and S2c given by the following Equations (1), (2) and (3):

$$S2a=Ws-Rs=Gs+Bs \quad (1)$$

$$S2b=Ws-Bs+Rs=2Rs+Gs \quad (2)$$

$$S2c=Ws+Bs=Rs+Gs+2Bs \quad (3)$$

In these equations, 2Rs and 2Bs indicate that their intensities are twice as high as those of Rs and Bs. The same can be said about other similar signs, too. By making the additions represented by these Equations (1), (2) and (3), S2a+S2b+S2c=3Ws can be derived and luminance information Ws can be obtained. And Rs, Gs and Bs can be calculated by the following Equations (4), (5) and (6), respectively:

$$Rs=(-2S2a+S2b+S2c)/3 \quad (4)$$

$$Gs=(4S2a+S2b-2S2c)/3 \quad (5)$$

$$Bs=(-S2a-S2b+2S2c)/3 \quad (6)$$

In this manner, signals representing the respective colors R, G and B can be obtained by making computations based on the photoelectrically converted signals S2a, S2b and S2c. On top of that, since each photosensitive cell receives a light ray representing the G component, the image sensor of this preferred embodiment realizes both high sensitivity and high resolution alike.

As described above, according to this preferred embodiment, by using a dispersive element that produces split R rays and a dispersive element that produces split B rays in an image sensor with a pixel shifted arrangement, a fundamental arrangement consisting of three pixels is realized. In each unit, the dispersive element that directs one of the split R rays diagonally upward (i.e., in the α direction) in FIG. 3(a) and the dispersive element that directs one of the split B rays diagonally downward (i.e., in the β direction that is different from the α direction) are arranged to face two adjacent pixels. As a result, using a fundamental arrangement consisting of the minimum number of pixels (i.e., three pixels), signals representing the R, G and B components can be obtained by making computations on the photoelectrically converted signals provided by the respective pixels. What is more, since each pixel includes a G component in this pixel shifted arrangement, the image sensor of this preferred embodiment would realize both high sensitivity and high resolution at the same time.

It should be noted that the image sensor of this preferred embodiment, which uses a fundamental arrangement consisting of three pixels and which obtains color information by making computations on the photoelectrically converted signals provided by the three pixels, does not necessarily have the pixel shifted arrangement. A similar effect can also be achieved by the conventional square arrangement. Also, in the preferred embodiment described above, the line b-b' that passes the respective centers of the photosensitive cells 2a and 2b in each unit crosses the line c-c' that passes the respective centers of the photosensitive cells 2b and 2c. However, even if the three photosensitive cells are arranged in line in each unit but if the dispersive elements are arranged appropriately, color information can still be obtained by making computations on the photoelectrically converted signals provided by the three photosensitive cells. Furthermore, in the preferred embodiment described above, the photosensitive cells 2a and 2c are supposed to be adjacent to the other photosensitive cell 2b in each unit. However, it is not always necessary to adopt such an arrangement. Rather, as long as the dispersive elements are appropriately arranged so that the photoelectrically converted signals provided by the three photosensitive cells are different from each other, the color information can be obtained by making those computations, no matter how the three photosensitive cells are arranged. Furthermore, in the preferred embodiment described above, every unit 40 is supposed to point to the same direction. However, the same effect can also be achieved even if not all of those units 40 point to the same direction.

In the first preferred embodiment described above, each unit includes two dispersive elements. One of the two dispersive elements makes an R ray incident on a photosensitive cell that is located diagonally (i.e., in the α direction shown in FIG. 3(a)) with respect to the dispersive element as viewed perpendicularly to the imaging area. The other dispersive element makes a B ray incident on a photosensitive cell that is located differently diagonally (i.e., in the β direction shown in FIG. 3(a)) with respect to the dispersive element as viewed perpendicularly to the imaging area. However, this arrangement does not always have to be adopted according to the present invention. Rather, even an image sensor, of which each unit includes only one dispersive element, can also obtain the color information in the same way. If the image sensor is designed so that the only dispersive element of each unit makes a light ray falling within a first wavelength range, including at least a green wavelength range, incident on a photosensitive cell that is located right under itself and also splits the rest of the light into two light rays falling within different wavelength ranges and makes those light rays incident on two other photosensitive cells, color signals can also be obtained by making computations on the photoelectrically converted signals provided by those three photosensitive cells.

In the preferred embodiment described above, the micro prism 1a is arranged so as to make an R ray incident on the photosensitive cell 2b, while the micro prism 1b is arranged so as to make a B ray incident on the photosensitive cell 2c. However, the micro prisms 1a and 1b are not necessarily arranged that way. Rather the same effect will be achieved even if the micro prisms 1a and 1b are switched with each other.

The image capture device of this preferred embodiment uses micro prisms as dispersive elements. However, the dispersive elements do not have to be micro prisms. Any other optical element may also be used as the dispersive element as long as the optical element can split the incoming light into multiple light rays according to their wavelength ranges and can make those light rays incident on very small areas that correspond in size to photosensitive cells. For example, dispersive elements that use diffraction of light to be described below for a second specific preferred embodiment of the present invention may be used.

Embodiment 2

Hereinafter, a second specific preferred embodiment of the present invention will be described with reference to FIGS. 4(a) to 4(c) and FIG. 5. The image capture device of this preferred embodiment has quite the same configuration as the counterpart of the first preferred embodiment described above except its solid-state image sensor. Thus, the following description will be focused on only the differences from the first preferred embodiment described above. In the following description, any component having substantially the same function as its counterpart of the first preferred embodiment described above will be identified by the same reference numeral as the one used for the first preferred embodiment.

Figure 4:
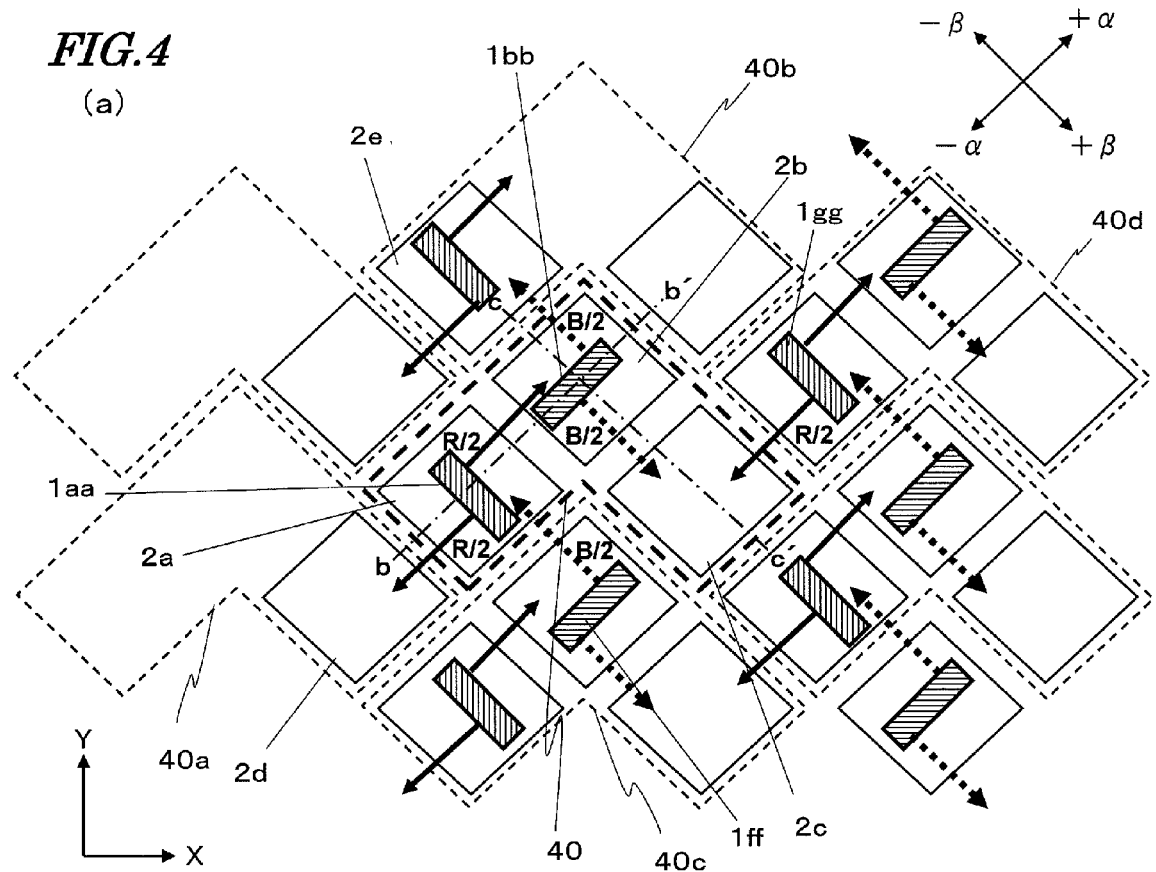
FIG. 4(a) is a pixel plan view according to a second specific preferred embodiment of the present invention and FIGS. 4(b) and 4(c) are cross-sectional views of the pixel plane of the second preferred embodiment as viewed on the plane b-b' and c-c', respectively.
Figure 4:
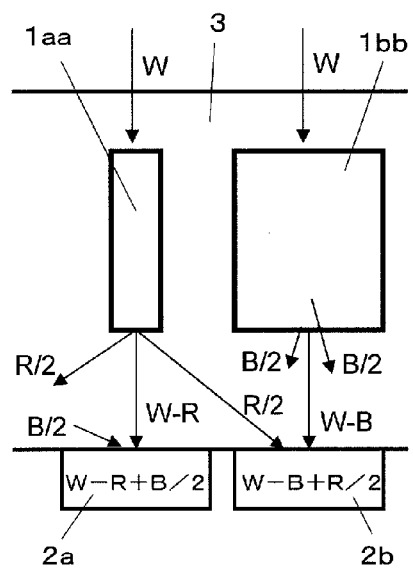
Figure 4:
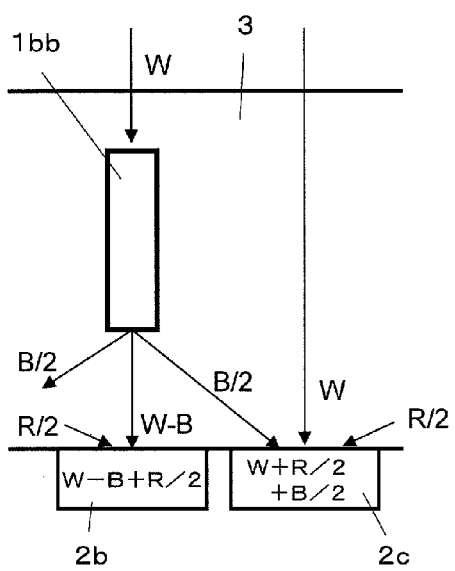
Figure 5:
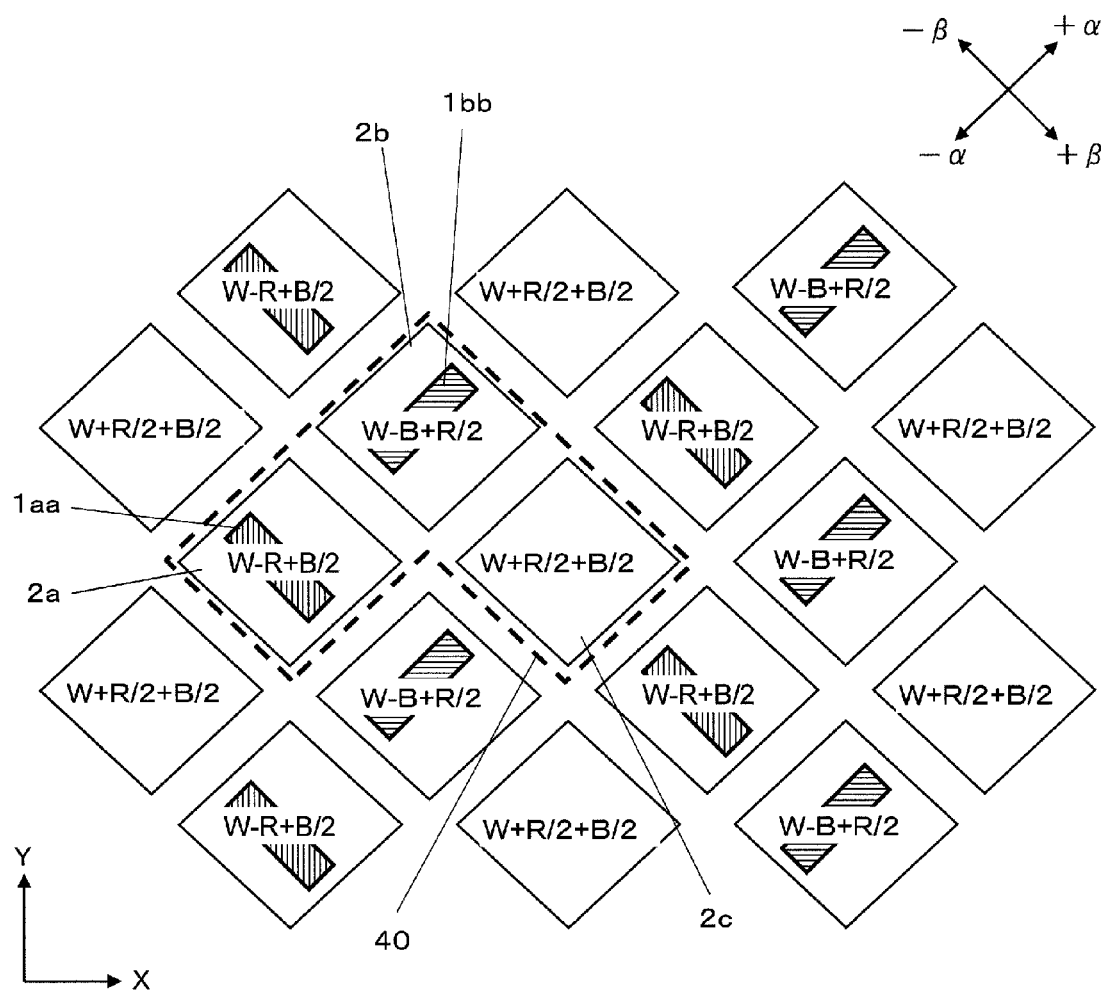
FIG. 5 shows what photoelectrically converted signals are generated by respective photosensitive cells in the second preferred embodiment of the present invention.

FIG. 4(a) is a pixel plan view illustrating a part of an array of dispersive elements, a part of an array of photosensitive cells and how light is split in a solid-state image sensor according to this preferred embodiment. On the other hand, FIGS. 4(b) and 4(c) are cross-sectional views of the image sensor as viewed on respective planes b-b' and c-c' shown in FIG. 4(a). FIG. 5 shows the respective color components of the light rays incident on the photosensitive cells. The arrangements of the array of photosensitive cells and the array of dispersive elements of this preferred embodiment are the same as those of the first preferred embodiment described above. But each dispersive element of this preferred embodiment splits the incoming light differently from its counterpart of the first preferred embodiment described above.

In this preferred embodiment, the micro prisms of the first preferred embodiment are replaced with dispersive elements that use diffraction of light. A dispersive element of that type includes a high-refractive-index transparent member (which will be referred to herein as a "core portion"), which is made of a material with a relatively high refractive index, and a low-refractive-index transparent member (which will be referred to herein as a "clad portion"), which is made of a material with a relatively low refractive index and which contacts with the side surfaces of the core portion. The incoming light is diffracted due to a difference in refractive index between the core and clad portions. That is why the core portion directs a split primary color ray toward a photosensitive cell that is located diagonally below the core portion and also makes a complementary color ray fall straight down toward a photosensitive cell that is located right under itself. Since the incoming light can be split into multiple light rays due to the presence of the core portion, each high-refractive-index transparent member will be referred to herein as a sort of "dispersive element".

Even with such a dispersive element that is made of two materials with mutually different refractive indices and that produces diffraction, color signals can also be obtained as efficiently as with micro prisms by making simple computations on the photoelectrically converted signals provided by the photosensitive cells. As a result, a color image capture device that would achieve high optical efficiency is also realized even by using such dispersive elements.

As shown in FIGS. 4(a) to 4(c), the high-refractive-index transparent member 1aa splits the incoming light into two halves of an R ray (which go in two different directions) and a cyan ray (Cy=G+B) representing its complementary color due to a difference in refractive index from the low-refractive-index transparent member 3. Then, the high-refractive-index transparent member 1aa makes the cyan ray fall straight down onto the photosensitive cell 2a right under itself and also directs the two halves of the R ray toward a photosensitive cell 2b and a photosensitive cell 2d of an adjacent unit 40a that are located diagonally (i.e., in the ±α directions) with respect to itself as indicated by the solid arrows in FIG. 4(a). On the other hand, the high-refractive-index transparent member 1bb splits the incoming light into two halves of a B ray (which go in two different directions) and a yellow ray (Ye=R+B) representing its complementary color due to a difference in refractive index from the low-refractive-index transparent member 3. Then, the high-refractive-index transparent member 1bb makes the yellow ray fall straight down onto the photosensitive cell 2b right under itself and also directs the two halves of the B ray toward a photosensitive cell 2c and a photosensitive cell 2e of an adjacent unit 40b that are located diagonally (i.e., in the ±β directions) with respect to itself as indicated by the one-dot chain arrows in FIG. 4(a). Meanwhile, directly incident light also strikes the photosensitive cell 2c without passing through any dispersive element. The two halves (B/2) of the B ray that are directed diagonally downward from the high-refractive-index transparent member 1bb in FIG. 4(b) are the same as those of the B ray that leave the high-refractive-index transparent member 1bb shown in FIG. 4(c).

Therefore, the photosensitive cell 2a receives not only the G and B rays from the high-refractive-index transparent member 1aa that faces that cell 2a but also a half of the B ray from the high-refractive-index transparent member 1ff of an adjacent unit 40c. The photosensitive cell 2b receives not only the G and R rays from the high-refractive-index transparent member 1bb that faces that cell 2b but also a half of the R ray from the high-refractive-index transparent member 1aa that faces the photosensitive cell 2a. And the photosensitive cell 2c receives directly incident light, a half of the B ray that has come from the high-refractive-index transparent member 1bb that faces the photosensitive cell 2b, and a half of the R that has come from the high-refractive-index transparent member 1gg of an adjacent unit 40d. FIG. 5 shows the color components of the light rays received by the respective photosensitive cells.

With such an arrangement, the photoelectrically converted signals S2a, S2b and S2c provided by the photosensitive cells 2a, 2b and 2c included in each unit 40 are respectively represented by the following Equations (7), and (9):

$$S2a = Ws - Rs + Bs/2 = Gs + 3Bs/2 \quad (7)$$

$$S2b = Ws - Bs + Rs/2 = 3Rs/2 + Gs \quad (8)$$

$$S2c = Ws + Rs/2 + Bs/2 = 3Rs/2 + Gs + 3Bs/2 \quad (9)$$

By making the additions represented by these Equations (7), (8) and (9), S2a+S2b+S2c=3Ws can be derived and luminance information Ws can be obtained. And Rs, Gs and Bs can be calculated by the following Equations (10), (11) and (12), respectively:

$$Rs=2(S2c-S2a)/3 \quad (10)$$

$$Gs=S2a+S2b-S2c \quad (11)$$

$$Bs=2(S2c-S2b)/3 \quad (12)$$

In this manner, signals representing the respective colors R, G and B can be obtained by making computations based on the photoelectrically converted signals S2a, S2b and S2c. Particularly, according to this preferred embodiment, R and B components can be obtained very easily by making a simple subtraction between two photoelectrically converted signals. On top of that, since each photosensitive cell receives a light ray representing the G component, the image sensor of this preferred embodiment realizes both high sensitivity and high resolution alike.

As described above, according to this preferred embodiment, by using a dispersive element that produces split R rays and a dispersive element that produces split B rays in an image sensor with a pixel shifted arrangement, a fundamental arrangement consisting of three pixels is realized. In each unit, the dispersive element that directs the two halves of the split R ray diagonally (i.e., in the ±α directions) in FIG. 4(a) and the dispersive element that directs the two halves of the split B ray diagonally (i.e., in the ±β direction that are different from the ±α directions) are arranged to face two adjacent pixels. As a result, using a fundamental arrangement consisting of the minimum number of pixels (i.e., three pixels), signals representing the R, G and B components can be obtained by making simple subtractions on the photoelectrically converted signals provided by the respective pixels. What is more, since each pixel includes a G component in this pixel shifted arrangement, the image sensor of this preferred embodiment would realize both high sensitivity and high resolution at the same time.

In the preferred embodiment described above, each photosensitive cell is supposed to receive the entire half of R ray (R/2) or the entire half of B ray (B/2) that has come from a dispersive element that faces one of its adjacent photosensitive cells. However, not all that half of R or B ray has to be received. For example, even if a light ray that has left one dispersive element has been partially lost before it is received by the photosensitive cell, color information can still be approximated by making the computations described above. For instance, suppose the intensity of a half of R ray (R/2) to be incident on a photosensitive cell that is adjacent to the photosensitive cells facing the dispersive elements 1aa and 1gg is a first intensity and the intensity of a half of B ray (B/2) to be incident on a photosensitive cell that is adjacent to the photosensitive cells facing the dispersive elements 1bb and 1ff is a second intensity in FIG. 4(a). In that case, the intensity of a B ray received by the photosensitive cell 2a from the dispersive element 1ff (which will be referred to herein as a "third intensity") may be different from the second intensity. Also, the intensity of an R ray received by the photosensitive cell 2b from the dispersive element 1aa (which will be referred to herein as a "fourth intensity") may be different from the first intensity. Furthermore, the intensity of an R ray received by the photosensitive cell 2c from the dispersive element 1bb (which will be referred to herein as a "fifth intensity") may be different from the first intensity. Furthermore, the intensity of a B ray received by the photosensitive cell 2c from the dispersive element 1gg (which will be referred to herein as a "sixth intensity") may be different from the second intensity.

It should be noted that the image sensor of this preferred embodiment, which uses a fundamental arrangement consisting of three pixels and which obtains color information by making computations on the photoelectrically converted signals provided by the three pixels, does not necessarily have the pixel shifted arrangement. A similar effect can also be achieved by the conventional square arrangement. Also, in the preferred embodiment described above, the line b-b' that passes the respective centers of the photosensitive cells 2a and 2b in each unit crosses the line c-c' that passes the respective centers of the photosensitive cells 2b and 2c. However, even if the three photosensitive cells are arranged in line in each unit but if the dispersive elements are arranged appropriately, color information can still be obtained by making computations on the photoelectrically converted signals provided by the three photosensitive cells. Furthermore, in the preferred embodiment described above, the photosensitive cells 2a and 2c are supposed to be adjacent to the other photosensitive cell 2b in each unit. However, it is not always necessary to adopt such an arrangement. Rather, as long as the dispersive elements are appropriately arranged so that the photoelectrically converted signals provided by the three photosensitive cells are different from each other, the color information can be obtained by making those computations, no matter how the three photosensitive cells are arranged. Furthermore, in the preferred embodiment described above, every unit 40 is supposed to point to the same direction. However, the same effect can also be achieved even if not all of those units 40 point to the same direction.

In the preferred embodiment described above, the high-refractive-index transparent member 1aa is arranged so as to make a half of the R ray incident on the photosensitive cells 2b and 2d, while the high-refractive-index transparent member 1bb is arranged so as to make a half of the B ray incident on the photosensitive cells 2c and 2e. However, the high-refractive-index transparent members 1aa and 1bb do not always have to be arranged that way. Rather, the same effect will be achieved even if the high-refractive-index transparent members 1aa and 1bb are switched with each other.

The image capture device of this preferred embodiment uses high-refractive-index transparent members as dispersive elements. However, the dispersive elements do not have to be such high-refractive-index transparent members. Any other optical element may also be used as the dispersive element as long as the optical element can split the incoming light into multiple light rays according to their wavelength ranges and can make those light rays incident on very small areas that correspond in size to the photosensitive cells. For example, the micro prisms of the first preferred embodiment described above may also be used.

Embodiment 3

Hereinafter, a third specific preferred embodiment of the present invention will be described with reference to FIGS. 6(a) to 6(c). The image capture device of this preferred embodiment has quite the same configuration as the counterpart of the first preferred embodiment described above except its solid-state image sensor. Thus, the following description will be focused on only the differences from the first preferred embodiment described above. In the following description, any component having substantially the same function as its counterpart of the first preferred embodiment described above will be identified by the same reference numeral as the one used for the first preferred embodiment.

Figure 6:
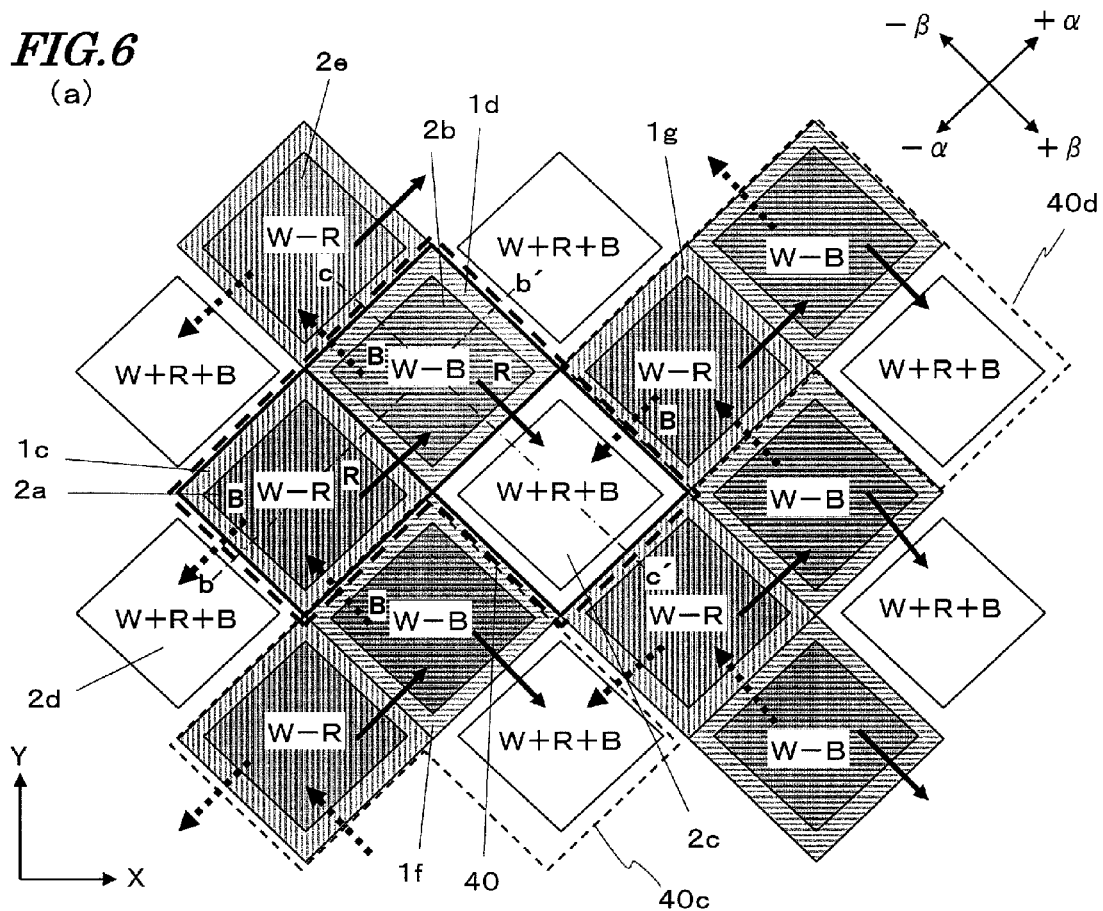
FIG. 6(a) is a pixel plan view according to a third specific preferred embodiment of the present invention and FIGS. 6(b) and 6(c) are cross-sectional views of the pixel plane of the third preferred embodiment as viewed on the plane b-b' and c-c', respectively.
Figure 6:
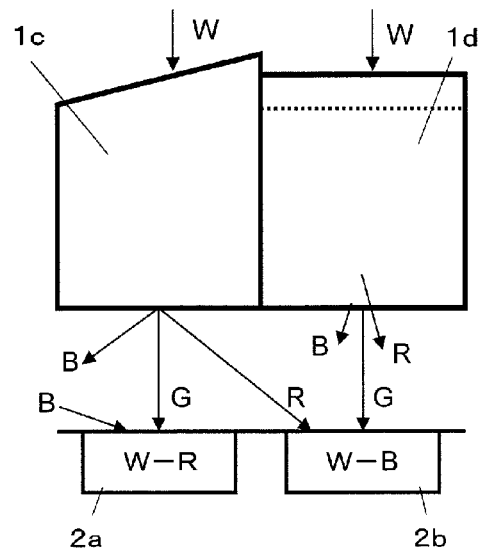
Figure 6:
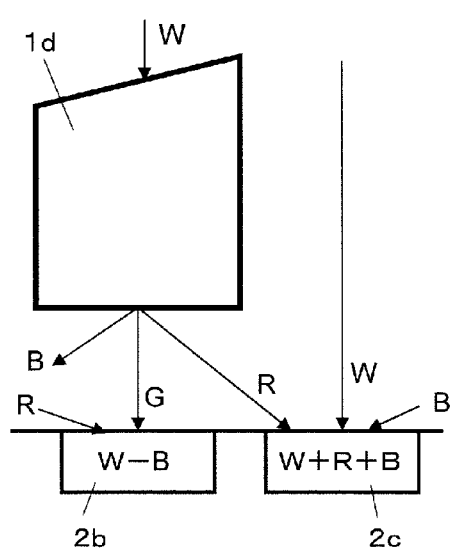

FIG. 6(a) is a pixel plan view illustrating a part of an array of dispersive elements, a part of an array of photosensitive cells and how light is split in a solid-state image sensor according to this preferred embodiment. On the other hand, FIGS. 6(b) and 6(c) are cross-sectional views of the image sensor as viewed on respective planes b-b' and c-c' shown in FIG. 6(a). FIGS. 6(a) to 6(c) show the respective color components of the light rays incident on the photosensitive cells. The arrangements of the array of photosensitive cells and the array of dispersive elements of this preferred embodiment are the same as those of the first preferred embodiment described above. But each dispersive element of this preferred embodiment splits the incoming light differently from its counterpart of the first preferred embodiment described above. As in the example illustrated in FIGS. 3(a) to 3(c), the dispersive elements illustrated in FIGS. 6(a) to 6(c) are also micro prisms.

As shown in FIGS. 6(a) to 6(c), both of the micro prisms 1c and 1d split the incoming light into R, B and G rays and are arranged so as to face mutually different directions. Specifically, the micro prism 1c makes the G ray fall straight down toward the photosensitive cell 2a right under itself. Also, the micro prism 1c directs the R ray diagonally upward (i.e., in the +α direction) to the photosensitive cell 2b as indicated by the solid arrow in FIG. 6(a) and also directs the B ray in the opposite direction (i.e., in the −α direction) to the photosensitive cell 2d as indicated by the dotted arrow in FIG. 6(a). The micro prism 1d faces a different direction from the micro prism 1c. Specifically, the micro prism 1d makes the G ray fall straight down toward the photosensitive cell 2b that faces the prism 1d. Also, the micro prism 1d directs the R ray diagonally downward (i.e., in the +β direction) to the photosensitive cell 2c as indicated by the solid arrow in FIG. 6(a) and also directs the B ray in the opposite direction (i.e., in the −β direction) to the photosensitive cell 2e as indicated by the dotted arrow in FIG. 6(a). Meanwhile, no micro prisms are provided to face the photosensitive cell 2c that directly incident light strikes without passing through any dispersive element. It should be noted that the R and B rays that are directed diagonally downward from the micro prism 1d as indicated by the solid arrows in FIG. 6(b) are the same as the R and B rays leaving the micro prism 1d in FIG. 6(c).

In this preferred embodiment, the micro prisms 1c and 1d may be the same as their counterpart shown in FIG. 8 but has had its length L adjusted so that an R ray is split in one direction and a B ray is split in another direction.

Consequently, the photosensitive cell 2a receives the G ray from the micro prism 1c that faces that cell 2a and also receives the B ray from a micro prism 1f of an adjacent unit 40c. That is why the B ray is not increased or decreased and the photosensitive cell 2a does not receive only the R ray of the incoming light that has impinged on the micro prism 1c. On the other hand, the photosensitive cell 2b receives the G ray from the micro prism 1d that faces that cell 2b and also receives the R ray from the micro prism 1c. That is why the R ray is not increased or decreased and the photosensitive cell 2b does not receive only the B ray of the incoming light that has impinged on the micro prism 1d. And the photosensitive cell 2c receives directly incident light, the R ray that has come from the micro prism 1d and the B ray that has come from the micro prism 1g of an adjacent unit 40d.

With such an arrangement, the photoelectrically converted signals S2a, S2b and S2c provided by the photosensitive cells 2a, 2b and 2c included in each unit 40 are respectively represented by the following Equations (13), (14) and (15):

$$S2a = Ws - Rs - Gs + Bs \tag{13}$$

$$S2b = Ws - Bs - Rs + Gs \tag{14}$$

$$S2c = Ws + Rs + Bs = 2Rs + Gs + 2Bs \tag{15}$$

By making the additions represented by these Equations (13), (14) and (15), S2a+S2b+S2c=3Ws can be derived and luminance information Ws can be obtained. And Rs, Gs and Bs can be calculated by the following Equations (16), (17) and (18), respectively:

$$Rs = (-2S2a + S2b + S2c)/3 \tag{16}$$

$$Gs = (-2S2a + 4S2b + S2c)/3 \tag{17}$$

$$Bs = (S2a - 2S2b + S2c)/3 \tag{18}$$

In this manner, signals representing the respective colors R, G and B can be obtained with no optical loss just by making computations based on the photoelectrically converted signals S2a, S2b and S2c. On top of that, since each photosensitive cell receives a light ray representing the G component, the image sensor of this preferred embodiment realizes both high sensitivity and high resolution alike.

As described above, according to this preferred embodiment, by using dispersive elements that produce split R and B rays in an image sensor with a pixel shifted arrangement, a fundamental arrangement consisting of three pixels is realized. In each unit, two dispersive elements are arranged. One of the two dispersive elements directs one of the split R rays diagonally (i.e., in the +α direction) and also directs one of the split B rays in the opposite direction (i.e., in the −α direction) in FIG. 6(a). The other dispersive element directs one of the split R rays diagonally (i.e., in the +β direction that is different from the ±α direction) and also directs one of the split B rays in the opposite direction (i.e., in the −β direction). And these two dispersive elements are arranged so as to face two adjacent pixels. As a result, using a fundamental arrangement consisting of the minimum number of pixels (i.e., three pixels), signals representing the R, G and B components can be obtained by making computations on the photoelectrically converted signals provided by the respective pixels. What is more, since each pixel includes a G component in this pixel shifted arrangement, the image sensor of this preferred embodiment would realize both high sensitivity and high resolution at the same time.

In the preferred embodiment described above, each photosensitive cell is supposed to receive the entire R or B ray that has come from a micro prism that faces one of its adjacent photosensitive cells. However, not all of that R or B ray has to be received. For example, even if a light ray that has left one dispersive element has been partially lost before it is received by the photosensitive cell, color information can still be approximated by making the computations described above. For instance, suppose the intensity of an R ray to be incident on a photosensitive cell that is adjacent to the photosensitive cells facing the micro prisms 1c, 1d, 1f and 1g is a first intensity and the intensity of a B ray to be incident on a photosensitive cell that is adjacent to the photosensitive cells facing the micro prisms 1c, 1d, 1f and 1g is a second intensity in FIG. 6(a). In that case, the intensity of a B ray received by the photosensitive cell 2a from the micro prism 1f (which will be referred to herein as a "third intensity") may be different from the second intensity. Also, the intensity of an R ray received by the photosensitive cell 2b from the micro prism element 1c (which will be referred to herein as a "fourth intensity") may be different from the first intensity. Furthermore, the intensity of an R ray received by the photosensitive cell 2c from the micro prism 1d (which will be referred to herein as a "fifth intensity") may be different from the first intensity. Furthermore, the intensity of a B ray received by the photosensitive cell 2c from the micro prism 1g (which will be referred to herein as a "sixth intensity") may be different from the second intensity.

In the preferred embodiment described above, the micro prism 1c directs the R and B rays toward the photosensitive cells 2b and 2d, respectively, while the micro prism 1d directs the R and B rays toward the photosensitive cells 2c and 2e, respectively. However, this is only an example and these directions are not necessarily adopted. Alternatively, each of the micro prisms 1c and 1d may be arranged to face the opposite direction as well. In other words, the micro prism 1c may direct the R and B rays toward the photosensitive cells 2d and 2b, respectively, while the micro prism 1d may direct the R and B rays toward the photosensitive cells 2e and 2c, respectively. Furthermore, according to the present invention, the same effect will also be achieved even if the micro prisms 1c and 1d are switched with each other.

It should be noted that the image sensor of this preferred embodiment, which uses a fundamental arrangement consisting of three pixels and which obtains color information by making computations on the photoelectrically converted signals provided by the three pixels, does not necessarily have the pixel shifted arrangement. A similar effect can also be achieved by the conventional square arrangement. Also, in the preferred embodiment described above, the line b-b' that passes the respective centers of the photosensitive cells 2a and 2b in each unit crosses the line c-c' that passes the respective centers of the photosensitive cells 2b and 2c. However, even if the three photosensitive cells are arranged in line in each unit but if the dispersive elements are arranged appropriately, color information can still be obtained by making computations on the photoelectrically converted signals provided by the three photosensitive cells. Furthermore, in the preferred embodiment described above, the photosensitive cells 2a and 2c are supposed to be adjacent to the other photosensitive cell 2b in each unit. However, it is not always necessary to adopt such an arrangement. Rather, as long as the dispersive elements are appropriately arranged so that the photoelectrically converted signals provided by the three photosensitive cells are different from each other, the color information can be obtained by making those computations, no matter how the three photosensitive cells are arranged. Furthermore, in the preferred embodiment described above, every unit 40 is supposed to point to the same direction. However, the same effect can also be achieved even if not all of those units 40 point to the same direction.

The image capture device of this preferred embodiment uses micro prisms as dispersive elements. However, the dispersive elements do not have to be micro prisms. Any other optical element may also be used as the dispersive element as long as the optical element can split the incoming light into multiple light rays according to their wavelength ranges and can make those light rays incident on very small areas that correspond in size to the photosensitive cells. For example, the dispersive elements that use diffraction of light as already described for the second preferred embodiment of the present invention may also be used.

Embodiment 4

Hereinafter, a fourth specific preferred embodiment of the present invention will be described with reference to FIGS. 7(a) to 7(c). The image capture device of this preferred embodiment has quite the same configuration as the counterpart of the third preferred embodiment described above except its solid-state image sensor. Thus, the following description will be focused on only the differences from the third preferred embodiment described above. In the following description, any component having substantially the same function as its counterpart of the third preferred embodiment described above will be identified by the same reference numeral as the one used for the third preferred embodiment.

Figure 7:
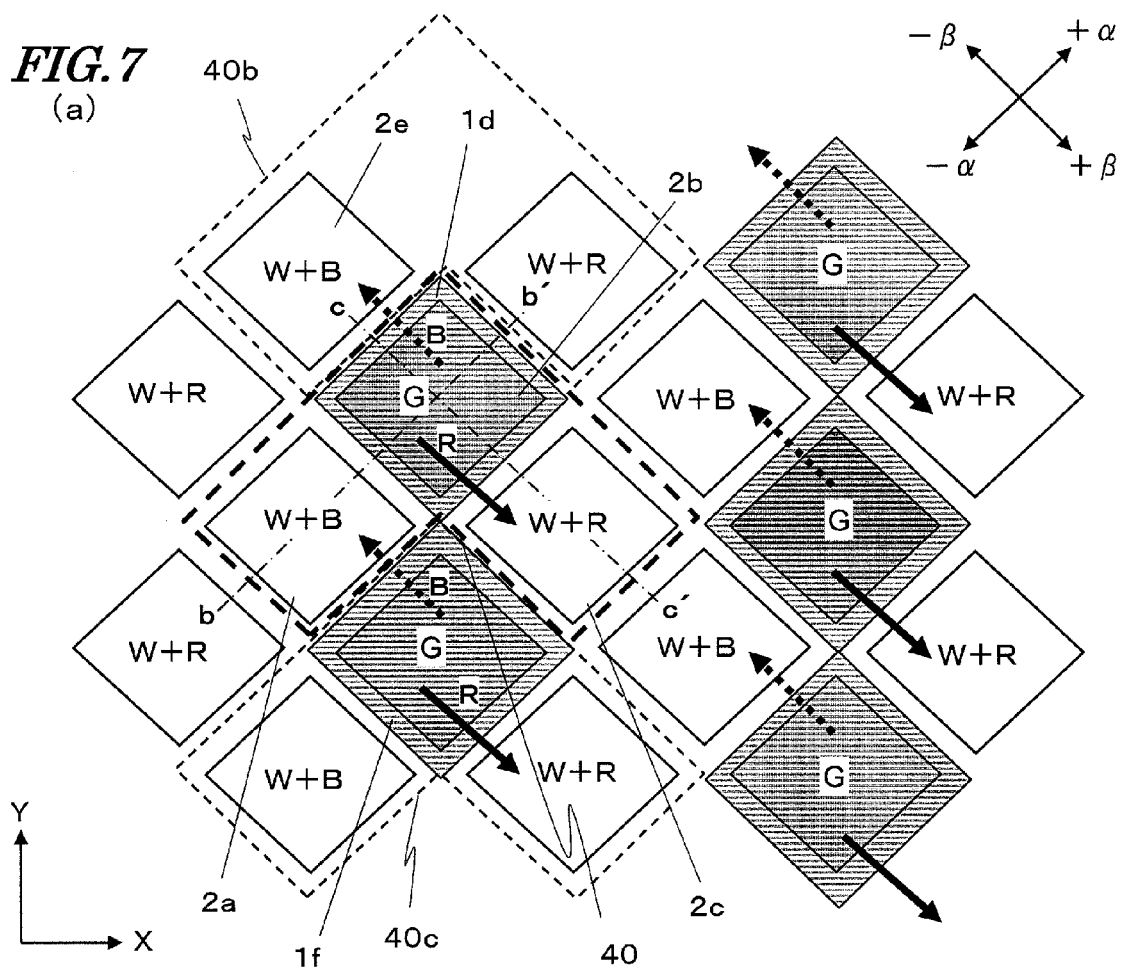
FIG. 7(a) is a pixel plan view according to a fourth specific preferred embodiment of the present invention and FIGS. 7(b) and 7(c) are cross-sectional views of the pixel plane of the fourth preferred embodiment as viewed on the plane b-b' and c-c', respectively.
Figure 7:
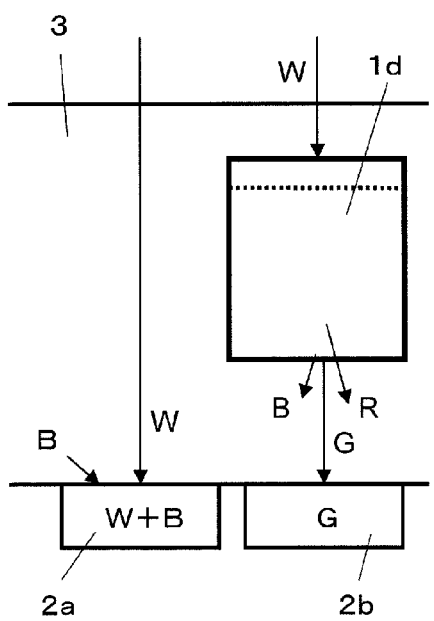
Figure 7:
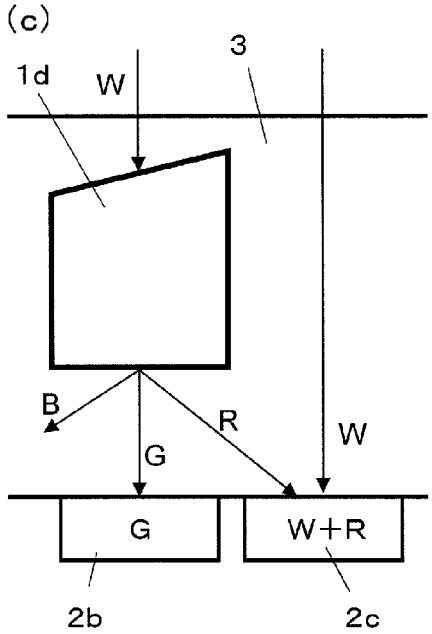

FIG. 7(a) is a pixel plan view illustrating a part of an array of dispersive elements, a part of an array of photosensitive cells and how light is split in a solid-state image sensor according to this preferred embodiment. On the other hand, FIGS. 7(b) and 7(c) are cross-sectional views of the image sensor as viewed on respective planes b-b' and c-c' shown in FIG. 7(a). FIGS. 7(a) to 7(c) also show the respective color components of the light rays incident on the photosensitive cells. The arrangement of the array of photosensitive cells of this preferred embodiment is the same as that of the third preferred embodiment described above. However, micro prisms are arranged differently in this preferred embodiment from the third preferred embodiment. Specifically, according to this preferred embodiment, the micro prism 1c of the third preferred embodiment is omitted but only the micro prism 1d is provided as a dispersive element. The micro prism 1d is also arranged to face the photosensitive cell 2b and has the same dispersive property as its counterpart of the third preferred embodiment described above.

As shown in FIGS. 7(a) to 7(c), the micro prism 1d splits the incoming light into R, B and G rays and makes the G ray fall straight down toward the photosensitive cell 2b right under itself. Also, the micro prism 1d directs the R ray toward the photosensitive cell 2c as indicated by the solid arrow in FIG. 7(a) and also directs the B ray toward a photosensitive cell 2e of an adjacent unit 40b as indicated by the dotted arrow in FIG. 7(a). Meanwhile, no micro prisms are provided to face the photosensitive cells 2a and 2c that directly incident light strikes without passing through any dispersive element. It should be noted that the R and B rays that are directed diagonally downward from the micro prism 1b as indicated by the two arrows in FIG. 7(b) are the same as the R and B rays leaving the micro prism 1b in FIG. 7(c).

Consequently, the photosensitive cell 2a receives directly incident light and a B ray that has come from the micro prism 1f of an adjacent unit 40c. The photosensitive cell 2b receives a G ray from the micro prism 1d that faces the cell 2b. And the photosensitive cell 2c receives the directly incident light and an R ray that has come from the adjacent micro prism 1d.

With such an arrangement, the photoelectrically converted signals S2a, S2b and S2c provided by the photosensitive cells 2a, 2b and 2c included in each unit 40 are respectively represented by the following Equations (19), (20) and (21):

$$S2a = Ws + Bs = Rs + Gs + 2Bs \tag{19}$$

$$S2b = Gs \tag{20}$$

$$S2c = Ws + Rs = 2Rs + Gs + Bs \tag{21}$$

By making the additions represented by these Equations (19), (20) and (21), $S2a + S2b + S2c = 3Ws$ can be derived and luminance information Ws can be obtained. Also, Gs can be obtained directly by Equation (20). And Rs and Bs can be calculated by the following Equations (22) and (23), respectively:

$$Rs = (-S2a - S2b + 2S2c)/3 \tag{22}$$

$$Bs = (2S2a - S2b - S2c)/3 \tag{23}$$

In this manner, signals representing the respective colors R, G and B can be obtained with no optical loss just by making computations based on the photoelectrically converted signals S2a, S2b and S2c. On top of that, since each photosensitive cell receives a light ray representing the G component, the image sensor of this preferred embodiment realizes high sensitivity.

As described above, according to this preferred embodiment, by using dispersive elements that produces split R and B rays in an image sensor with a pixel shifted arrangement, a fundamental arrangement consisting of three pixels is realized. As a result, using a fundamental arrangement consisting of the minimum number of pixels (i.e., three pixels), signals representing the R, G and B components can be obtained by making computations on the photoelectrically converted signals provided by the respective pixels. What is more, since each pixel includes a G component in this pixel shifted arrangement, the image sensor of this preferred embodiment would realize both high sensitivity and high resolution at the same time.

It should be noted that the image sensor of this preferred embodiment, which uses a fundamental arrangement consisting of three pixels and which obtains color information by making computations on the photoelectrically converted signals provided by the three pixels, does not necessarily have the pixel shifted arrangement. A similar effect can also be achieved by the conventional square arrangement. Also, in the preferred embodiment described above, the line b-b' that passes the respective centers of the photosensitive cells 2a and 2b in each unit crosses the line c-c' that passes the respective centers of the photosensitive cells 2b and 2c. However, even if the three photosensitive cells are arranged in line in each unit but if the dispersive elements are arranged appropriately, color information can still be obtained by making computations on the photoelectrically converted signals provided by the three photosensitive cells. Furthermore, in the preferred embodiment described above, the photosensitive cells 2a and 2c are supposed to be adjacent to the other photosensitive cell 2b in each unit. However, it is not always necessary to adopt such an arrangement. Rather, as long as the dispersive elements are appropriately arranged so that the photoelectrically converted signals provided by the three photosensitive cells are different from each other, the color information can be obtained by making those computations, no matter how the three photosensitive cells are arranged. Furthermore, in the preferred embodiment described above, every unit 40 is supposed to point to the same direction. However, the same effect can also be achieved even if not all of those units 40 point to the same direction.

In this preferred embodiment, the micro prism 1d is arranged to direct the R and B rays toward the photosensitive cells 2c and 2e, respectively. However, the micro prism 1d does not always have to be arranged that way. Alternatively, the micro prism 1d may also be arranged to face the direction opposite from the one the micro prism 1d shown in FIG. 7(a) faces. Still alternatively, the micro prism 1d may also be arranged to face the photosensitive cell 2a instead of the photosensitive cell 2b.

The image capture device of this preferred embodiment uses micro prisms as dispersive elements. However, the dispersive elements do not have to be micro prisms. Any other optical element may also be used as the dispersive element as long as the optical element can split the incoming light into multiple light rays according to their wavelength ranges and can make those light rays incident on very small areas that correspond in size to the photosensitive cells. For example, the dispersive elements that use diffraction of light as already described for the second preferred embodiment of the present invention may also be used.

In the foregoing description of the first through fourth preferred embodiments of the present invention, the specific type of the image sensor to use is not mentioned. However, according to the present invention, the solid-state image sensor may be any of various types of image sensors. Also, the present invention is applicable not only to a solid-state image sensor of a normal surface irradiation type but also no less effectively to an image sensor that receives incident light on the entire surface such as an image sensor of the reverse irradiation type.

INDUSTRIAL APPLICABILITY

The image capture device of the present invention can be used extensively in cameras that use a solid-state image sensor for general consumers including so-called "digital cameras" and "digital movie cameras", solid-state camcorders for broadcasts, industrial solid-state surveillance cameras, and so on. It should be noted that the present invention is applicable to every kind of color cameras even if the image capture device is not a solid-state imaging device.

REFERENCE SIGNS LIST 1, 1a, 1b, 1c, 1d, 1f, 1g micro prism
1aa, 1bb, 1cc, 1ff, 1gg high-refractive-index transparent member
2, 2a, 2b, 2c, 2d, 2e image sensor's photosensitive cell
3 low-refractive-index transparent member
11 micro lens
12 inner lens
13 dichroic mirror reflecting every ray but red (R) ray
14 dichroic mirror reflecting only green (G) ray
15 dichroic mirror reflecting only blue (B) ray
16 conventional micro prism
23, 24, 25 conventional image sensor's photosensitive cell
31 light-transmitting resin
32 dichroic mirror transmitting G ray
33 dichroic mirror transmitting R ray
34 organic dye filter transmitting G ray
35 organic dye filter transmitting R ray
36 micro lens
37 metal layer
40, 40a, 40b, 40c, 40d unit
100 image capturing section
101 optical lens
102 optical plate
103 image sensor
103a imaging area
104 signal generating and pixel signal receiving section
200 signal processing section
201 memory
202 video signal generating section
203 video interface section

The invention claimed is:
1. An image capture device comprising:
a solid-state image sensor;
an optical system for producing an image on an imaging area of the solid-state image sensor; and
a signal processing section for processing an electrical signal supplied from the solid-state image sensor,
wherein the solid-state image sensor includes
a photosensitive cell array, in which a number of photosensitive cells are arranged two-dimensionally on the imaging area, and
a dispersive element array, in which a number of dispersive elements are arranged for some of the photosensitive cells that form the photosensitive cell array, and
wherein the photosensitive cell array and the dispersive element array are formed of a number of units, and
wherein each said unit includes
first, second and third photosensitive cells, and
at least one dispersive element, which is arranged so as to face at least one of the first and second photosensitive cells, and wherein in each said unit,
each said dispersive element makes a part of its received light, which falls within a first wavelength range including at least a green wavelength range, incident on the photosensitive cell that faces the dispersive element, and also makes another part of its received light, which falls within a non-first wavelength range, incident on at least one photosensitive cell other than the photosensitive cell that faces the dispersive element, and
wherein the first, second and third photosensitive cells respectively output first, second and third photoelectrically converted signals representing the intensities of the light received by them, and
wherein the signal processing section outputs color information by making computations on the first, second and third photoelectrically converted signals.

2. The image capture device of claim 1, wherein in each said unit,
the second photosensitive cell is arranged adjacent to the first photosensitive cell,
the third photosensitive cell is arranged adjacent to the second photosensitive cell, and
supposing a line that connects together respective centers of the first and second photosensitive cells is called a first line and a line that connects together the respective centers of the second and third photosensitive cells is called a second line, the first and second lines cross each other.

3. The image capture device of claim 2, wherein the angle defined by the first line with respect to the vertical side of the imaging area is equal to the angle defined by the second line with respect to the vertical side of the imaging area.

4. The image capture device of claim 1, wherein in each said unit,
each said dispersive element makes a part of its received light, which falls within a red or blue wavelength range, incident on at least one photosensitive cell other than the photosensitive cell that faces the dispersive element.

5. The image capture device of claim 4, wherein each said unit includes:
a first dispersive element, which is arranged to face the first photosensitive cell, and
a second dispersive element, which is arranged to face the second photosensitive cell.

6. The image capture device of claim 5, wherein if one of the red and blue wavelength ranges is called a second wavelength range and the other is called a third wavelength range,
the first dispersive element makes a part of its received light, which falls within the second wavelength range, incident on the second photosensitive cell and also makes the rest of its received light incident on the first photosensitive cell, and
the second dispersive element makes a part of its received light, which falls within the third wavelength range, incident on the third photosensitive cell and also makes the rest of its received light incident on the second photosensitive cell, and
the first photosensitive cell receives the light that has impinged on the first dispersive element other than the light falling within the second wavelength range, and
the second photosensitive cell receives not only the light that has impinged on the second dispersive element other than the light falling within the third wavelength range but also the light that falls within the second wavelength range and that has come from the first dispersive element, and
the third photosensitive cell receives not only the incident light that has come directly without passing through any dispersive element but also the light that falls within the third wavelength range and that has come from the second dispersive element.

7. The image capture device of claim 5, wherein if one of the red and blue wavelength ranges is called a second wavelength range and the other is called a third wavelength range,
then in each said unit, the first dispersive element makes a part of its received light, which falls within the second wavelength range and which has a first quantity corresponding to a half of the light that falls within the second wavelength range, incident on the second photosensitive cell, makes the other half incident on a photosensitive cell included in a first adjacent unit, and also makes the rest of its received light that falls within the first and third wavelength ranges incident on the first photosensitive cell, and
the second dispersive element makes a part of its received light, which falls within the third wavelength range and which has a second quantity corresponding to a half of the light that falls within the third wavelength range, incident on the third photosensitive cell, makes the other half incident on a photosensitive cell included in a second adjacent unit, and also makes the light that falls within the first wavelength range and the light that falls within the second wavelength range incident on the second photosensitive cell, and
the first photosensitive cell receives not only the light that has impinged on the first dispersive element other than the light falling within the second wavelength range but also light having the second quantity, falling within the third wavelength range, and having come from a dispersive element included in a third adjacent unit, and
the second photosensitive cell receives not only the light that has impinged on the second dispersive element other than the light falling within the third wavelength range but also the light having the first quantity, falling within the second wavelength range, and having come from the first dispersive element, and
the third photosensitive cell receives the incident light that has come directly without passing through any dispersive element, the light having the second quantity, falling within the third wavelength range and having come from the second dispersive element, and the light having the first quantity, falling within the second wavelength range, and having come from a dispersive element included in a fourth adjacent unit.

8. The image capture device of claim 5, wherein if one of the red and blue wavelength ranges is called a second wavelength range and the other is called a third wavelength range,
then in each said unit, the first dispersive element makes a part of its received light, which has a first quantity and which falls within the second wavelength range, incident on the second photosensitive cell, makes another part of its received light, which has a second quantity and which falls within the third wavelength range, incident on a photosensitive cell included in a first adjacent unit, and also makes still another part of its received light, which falls within the first wavelength range, incident on the first photosensitive cell, and
the second dispersive element makes a part of its received light, which has the first quantity and which falls within the second wavelength range, incident on the third photosensitive cell, makes another part of its received light, which has the second quantity and which falls within the third wavelength range, incident on a photosensitive cell included in a second adjacent unit, and also makes still another part of its received light, which falls within the first wavelength range, incident on the second photosensitive cell, and
the first photosensitive cell receives not only the light that has impinged on the first dispersive element other than the light having the first quantity and falling within the second wavelength range and the light having the second quantity and falling within the third wavelength range but also light having a third quantity, falling within the third wavelength range and having come from a dispersive element included in a third adjacent unit, and the second photosensitive cell receives not only the light that has impinged on the second dispersive element other than the light having the first quantity and falling within the second wavelength range and the light having the second quantity and falling within the third wavelength range but also light having a fourth quantity, falling within the second wavelength range and having come from the first dispersive element, and the third photosensitive cell receives the incident light that has come directly without passing through any dispersive element, light having a fifth quantity, falling within the second wavelength range and having come from the second dispersive element, and light having a sixth quantity, falling within the third wavelength range and having come from a dispersive element included in a fourth adjacent unit.

9. The image capture device of claim 5, wherein if one of the red and blue wavelength ranges is called a second wavelength range and the other is called a third wavelength range, then in each said unit, the first dispersive element makes a part of its received light, which has a first quantity and which falls within the second wavelength range, incident on the second photosensitive cell, makes another part of its received light, which has a second quantity and which falls within the third wavelength range, incident on a photosensitive cell included in a first adjacent unit, and also makes still another part of its received light, which falls within the first wavelength range, incident on the first photosensitive cell, and the second dispersive element makes a part of its received light, which has the first quantity and which falls within the second wavelength range, incident on a photosensitive cell included in a second adjacent unit, makes another part of its received light, which has the second quantity and which falls within the third wavelength range, incident on the third photosensitive cell, and also makes still another part of its received light, which falls within the first wavelength range, incident on the second photosensitive cell, and the first photosensitive cell receives not only the light that has impinged on the first dispersive element other than the light having the first quantity and falling within the second wavelength range and the light having the second quantity and falling within the third wavelength range but also light having a third quantity, falling within the second wavelength range and having come from a dispersive element included in a third adjacent unit, and the second photosensitive cell receives not only the light that has impinged on the second dispersive element other than the light having the first quantity and falling within the second wavelength range and the light having the second quantity and falling within the third wavelength range but also light having a fourth quantity, falling within the second wavelength range and having come from the first dispersive element, and the third photosensitive cell receives the incident light that has come directly without passing through any dispersive element, light having a fifth quantity, falling within the third wavelength range and having come from a dispersive element included in a fourth adjacent unit, and light having a sixth quantity, falling within the third wavelength range and having come from the second dispersive element.

10. The image capture device of claim 8, wherein the fourth and fifth quantities are equal to the first quantity and wherein the third and sixth quantities are equal to the second quantity.

11. The image capture device of claim 4, wherein in each said unit, the dispersive element is arranged so as to face the first photosensitive cell, and if one of the red and blue wavelength ranges is called a second wavelength range and the other is called a third wavelength range, then the dispersive element makes a part of its received light, which has a first quantity and which falls within the second wavelength range, incident on the second photosensitive cell, makes another part of its received light, which has a second quantity and which falls within the third wavelength range, incident on a photosensitive cell included in a first adjacent unit, and also makes still another part of its received light, which falls within the first wavelength range, incident on the first photosensitive cell, and the first photosensitive cell receives the light that has impinged on the dispersive element other than the light falling within the second wavelength range and the light falling within the third wavelength range, and the second photosensitive cell receives not only the incident light that has come directly without passing through any dispersive element but also light having a first quantity, falling within the second wavelength range and having come from the dispersive element, and the third photosensitive cell receives not only the incident light that has come directly without passing through any dispersive element but also light having a second quantity, falling within the third wavelength range and having come from a dispersive element included in a second adjacent unit.

12. A solid-state image sensor comprising a photosensitive cell array, in which a number of photosensitive cells are arranged two-dimensionally on an imaging area, and a dispersive element array, in which a number of dispersive elements are arranged for some of the photosensitive cells that form the photosensitive cell array, and wherein the photosensitive cell array and the dispersive element array are formed of a number of units, and wherein each said unit includes first, second and third photosensitive cells, and at least one dispersive element, which is arranged so as to face at least one of the first and second photosensitive cells, and wherein in each said unit, each said dispersive element makes a part of its received light, which falls within a first wavelength range including at least a green wavelength range, incident on the photosensitive cell that faces the dispersive element, and also makes another part of its received light, which falls within a non-first wavelength range, incident on at least one photosensitive cell other than the photosensitive cell that faces the dispersive element, and wherein the first, second and third photosensitive cells respectively output first, second and third photoelectrically converted signals representing the intensities of the light received by them.

* * * * *